United States Patent
Maniwa et al.

(10) Patent No.: US 7,392,020 B2
(45) Date of Patent: Jun. 24, 2008

(54) TABLE REFERENCE TYPE PREDISTORTER

(75) Inventors: Toru Maniwa, Kawasaki (JP); Tokuro Kubo, Kawasaki (JP); Kazuo Nagatani, Kawasaki (JP); Hiroyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 707 days.

(21) Appl. No.: 10/999,495

(22) Filed: Nov. 30, 2004

(65) Prior Publication Data

US 2005/0079834 A1    Apr. 14, 2005

Related U.S. Application Data

(63) Continuation of application No. PCT/JP02/05373, filed on May 31, 2002.

(51) Int. Cl.
*H04B 1/04*    (2006.01)

(52) U.S. Cl. .................. 455/114.3; 455/114.2; 455/63.1; 455/67.13; 375/295; 375/296; 375/297; 330/136; 330/149

(58) Field of Classification Search .............. 455/114.3, 455/114.2, 63.1, 67.13; 375/295, 296, 297; 330/136, 149
See application file for complete search history.

(56) References Cited

U.S. PATENT DOCUMENTS

| 6,531,917 B2 | 3/2003 | Yamamoto et al. | |
| 6,771,708 B1 * | 8/2004 | Suga et al. | 375/278 |
| 6,859,099 B2 * | 2/2005 | Akaiwa | 330/149 |

FOREIGN PATENT DOCUMENTS

| EP | 1 204 216 | 5/2002 |
| JP | 08-037427 | 2/1996 |
| JP | 09-199959 | 7/1997 |
| JP | 10-322137 | 12/1998 |
| JP | 2000-078037 | 3/2000 |
| JP | 2001-251148 | 9/2001 |
| JP | 2001-313532 | 11/2001 |
| JP | 2001-352219 | 12/2001 |
| JP | 2002-064411 | 2/2002 |
| JP | 2002-135062 | 5/2002 |
| JP | 2002-135349 | 5/2002 |

OTHER PUBLICATIONS

Supplementary European Search Report dated Mar. 29, 2007, from the corresponding European Application.
Notice of Rejection Grounds dated Oct. 2, 2007, from the corresponding Japanese Application.

* cited by examiner

*Primary Examiner*—Sanh D Phu
(74) *Attorney, Agent, or Firm*—Katten Muchin Rosenman LLP

(57) ABSTRACT

The purpose of the present invention is to compensate the distortion of an amplifier by a predistorter which compensates the distortion of a power amplifier even when a frequency amplitude deviation exists. The predistorter comprises a distortion compensation coefficient storage unit for storing a distortion compensation coefficient corresponding to the reference value using the characteristic quantity of the envelope of a transmission signal before being inputted to the power amplifier as a reference value; and a reference value conversion unit for converting the characteristic quantity into a predetermined value according to the size of the characteristic quantity, and when the characteristic quantity is, for example, the amplitude value of an envelope and the amplitude value is small, that value is rounded up, for example, to an upper-limit value within a linear range of the amplifier.

18 Claims, 25 Drawing Sheets

US 7,392,020 B2

TABLE REFERENCE TYPE PREDISTORTER

CROSS REFERENCE TO RELATED APPLICATION

This application is a continuation of an International Application No. PCT/JP02/05373, which was filed on May 31, 2002.

BACKGROUND OF THE INVENTION

1. Field of the Invention

The present invention relates to a power amplifier for radio transmission which is used for a cellular phone and digital broadcasting, and more specifically to a predistorter which reduces the distortion of the power amplifier.

2. Description of the Related Art

A predistorter is available as a linear compensator for an amplification circuit having nonlinear characteristics. In a predistorter, the suppression of a distortion of an amplifier is realized, for example, by multiplying a coefficient according to the envelop of an original signal to be transmitted by the original signal as a predistortion coefficient for canceling the distortion of the amplifier. This predistortion coefficient, namely the distortion compensation coefficient is determined by the comparison of the original signal to be transmitted and the output signal of the amplifier.

FIG. 18 is a block diagram showing a first conventional configuration of a transmitter using such a predistorter. In FIG. 18, an input signal, namely an original signal to be transmitted is given to a multiplication circuit 101 provided in the preceding step of an amplifier 100. The predistortion coefficient stored in a predistortion coefficient table 102, namely the distortion compensation coefficient is multiplied and is inputted to the amplifier 100, and the output signal of the amplifier 100 is outputted via a directional coupler 103.

In regard to the reading of the data of the predistortion coefficient table 102, the envelope amplitude of an original signal is calculated, for example, by an envelope amplitude calculation unit 104, and the value of the amplitude is used as an address, and reference is made to the predistortion coefficient table 102.

Part of the output signal of the amplifier is given to a comparison computing unit 105 from the directional coupler 103; part of the signal and the input, namely the original signal are compared; a new distortion compensation coefficient is made by a coefficient making unit 106; and the predistortion coefficient table 102 is updated. In the coefficient making unit 106, for example, least mean square (LMS) is used as the algorithm for updating the coefficient.

FIG. 19 is a block diagram showing a second conventional configuration of a transmitter using a predistorter. In FIG. 19, the predistortion coefficient table 102 has a two-dimensional structure such that not only the value of the envelope amplitude but also the output of an envelope time differential calculation unit 107 which obtains the time differential of the envelope value or the time derivative of the envelope store the distortion compensation coefficient as an address, and the coefficient making unit 106 updates the distortion compensation coefficient using the calculation result of the envelope time differential calculation unit 107.

In regard to such a predistorter or a linear compensator, the following documents are available.

Document 1: Kokai (Jpn. unexamined patent publication) No. 54-140856 "Linear Compensator"

Document 2: Kokai (Jpn. unexamined patent publication) No. 9-69733 "Amplifier Having Distortion Compensation"

Document 3: Kokai (Jpn. unexamined patent publication) No. 2000-78037"Predistorter of Amplifier and Amplifying Device".

Disclosed in Document 1 is a linear compensator described below. A nonlinear error between the input and output of an amplifier circuit is detected at all times; said error is written in a read/write memory as a digital signal; data in which a signal input level is written as an address is read as the amount of compensation; and a linear compensator traces the nonlinear characteristics of the amplifier at all times and can compensate them by controlling a programmable attenuator.

Disclosed in Document 2 is an amplifier having a distortion compensation function which can reduce the capacity of the distortion compensation table using least mean square (LSM) or exponentially weighted sequential least mean square (RLS; recursive least squares) as an applicable algorithm.

Disclosed in document 3 is a predistorter which transforms an input signal and makes a final predistortion signal based on the compensation coefficient corresponding to the value of the input signal of derivative or integral, or both of them in order to reduce the adjacent channel leakage power of the output power of an amplifier.

In a predistorter which compares an original signal and part of the output signal of an amplifier to determine a predistortion coefficient, there was a problem in that a correct predistortion coefficient cannot be determined if a frequency amplitude deviation exists (when frequency characteristics of amplitude are not flat), or if a delay error exists between the original signal and the output signal of the amplifier.

There was another problem in that it takes time to converge a predistortion coefficient, and an error becomes large in the region where the envelope amplitude of the original signal is small, the fluctuations of the envelope are large, and the absolute value of the differential at a certain time interval is large.

FIG. 20 to FIG. 22 show the problem when a frequency amplitude deviation exists and the envelope amplitude of the original signal is small. FIG. 20 shows two unmodulated signals (continuous wave signals: CW signals) used to explain this problem. The two CW signals shown in FIG. 20 can be indicated by following expression.

$$\cos(\Delta\omega t)\cos(\omega t)$$

When such an original signal as shown in FIG. 20 is written on an IQ plane, it is illustrated as a thick line on an I plane as shown in FIG. 21.

However, when a frequency amplitude deviation exists, the input signal to the amplifier slips out of place and is expressed by an ellipse. Generally, the value of the envelope amplitude is expressed by the distance from the origin, so the original signal having the amplitude which should be shown in point A is shown in point B, and the value of the envelope amplitude becomes large.

FIG. 22 shows the distortion compensation coefficient which is made by the coefficient making unit 106 shown in FIG. 18 both when a frequency amplitude deviation exists and when no frequency amplitude deviation exists. When no frequency amplitude deviation exists, namely in the characteristics of the dotted line, an amplifier 100 has linear characteristics in the range in which the envelope amplitude as a reference value is small, and no distortion compensation should be required, thus making the value of distortion compensation coefficient 1. When the reference value becomes larger, the output of the amplifier 100 becomes saturated, so the value of distortion compensation coefficient to compensate the saturation becomes larger than 1.

On the other hand, when a frequency amplitude deviation exists, point A as an original signal is indicated as the signal of point B as described in FIG. 21, so the output of the amplifier 100 becomes larger than the value of linear characteristics if the value of distortion compensation coefficient remains to be 1. Consequently, a value smaller than 1 is obtained as a distortion compensation coefficient. The closer point A is to the original point, or the closer the reference value is to 0, the more rapidly the value of distortion compensation coefficient decreases at the positions in which the reference value is closer to 0. In such a case, as the result of multiplying the distortion compensation coefficient, a signal which becomes smaller like a spike in shape and is close to 0 is generated, thereby giving rise to a wide-band distortion.

As described above, when a frequency amplitude deviation exists, the predistorter outputs a distortion compensation coefficient which is close to 0 at the position in which the value of the envelope amplitude is small or the reference value is small. This is a natural action as a predistorter. When there exists no frequency amplitude deviation, a problem takes place in that this distortion compensation coefficient is multiplied to the original signal, so the input signal to the amplifier 100 becomes smaller, and the output error of the amplifier 100 becomes larger.

FIG. 23 to FIG. 25 show the problems in a range in which time delay exists in the output signal from an amplifier, and the absolute value of the time differential of the envelope value is large. In FIG. 23, the original signal is indicated by a thick line, and the waveform of time delay as the output signal of the amplifier is indicated by a thin line. When the size of the envelope becomes small in terms of time at a beginning position of FIG. 23, in other words, at the position in which the time differential value obtained by subtracting the envelope value at a prior time from the envelope value at a later time is minus, the signal which has passed through the amplifier, namely the value of the waveform of time delay looks larger than the value of the original signal, so the value of distortion compensation coefficient to correct this phenomenon becomes smaller than a correct value.

On the other hand, when the envelope value becomes large at the following position of FIG. 23, namely at the position in which the value of time differential is plus, the output signal of the amplifier looks smaller than the original signal, so the distortion compensation coefficient becomes larger than a correct value. Such an error becomes larger at the position in which the inclination of the signal is large or at the position in which the absolute value of time differential is large.

FIG. 24 shows the emergence frequency of the value of time differential and the value of envelope amplitude, using a CDMA (code division multiple access) signal as an example. From this figure, it is known that the emergence frequency is small at the position in which the absolute value of time differential is large.

FIG. 25 shows the spike-shaped error of the distortion compensation coefficient which emerges at the position in which the emergence frequency is small. Because the emergence frequency is small at the position in which the absolute value of time differential is large, as described in FIG. 24, it is considered that it takes time to converge the distortion compensation coefficient at such a position and that errors accumulate and spread. In such a case, a spike-shaped singular point of the distortion compensation coefficient emerges at only one position as shown in FIG. 25, and a problem takes place in that no correct distortion compensation effect can be obtained.

In view of the above-mentioned problems, the purpose of the present invention is to achieve the distortion compensation of a power amplifier using the correct value of a distortion compensation coefficient when a frequency amplitude deviation exists or the emergence frequency is small.

In other words, the purpose of the present invention is to compensate the distortion of an amplifier using the value of a correct distortion compensation coefficient when the value of envelope amplitude of an original signal is small, or at the position in which the time differential of the envelope value or the absolute value of time derivative is large.

SUMMARY OF THE INVENTION

FIG. 1 is a block diagram showing the configuration of the principle of the predistorter of the present invention. FIG. 1 is a block diagram showing the configuration of the principle of a predistorter 1 which performs operation using a distortion compensation coefficient for the input signal to a power amplifier which outputs a transmission power signal, and inputs the signal after the operation is performed to the power amplifier, and the predistorter comprises a distortion compensation coefficient storage unit 2 and a reference value conversion unit 3.

A characteristic quantity of the envelope of a transmission signal before being inputted to the power amplifier, for example, the amplitude value of the envelope, the time differential of the value of the envelope or the value of time derivative is used as the table reference value, the distortion compensation coefficient storage unit 2 stores the distortion compensation coefficient corresponding to the reference value. The reference value conversion unit 3 converts a characteristic quantity into a predetermined value according to the size of the characteristic quantity, and outputs the converted value as a new table reference value. In this conversion, rounding upwards to a predetermined value and rounding downwards to an absolute value are used.

In an embodiment, when the characteristic quantity is the envelope amplitude value of a transmission signal and amplitude value is small, the reference value conversion unit 3 can also round up the amplitude value to a predetermined value.

Furthermore, in an embodiment, when an unmodulated signal is included in a transmission signal, the reference value conversion unit 3 can round up the amplitude value to a value larger than the predetermined value. When a plurality of unmodulated signals are included in the transmission signal, the reference value conversion unit 3 can also change a value larger than the above-mentioned value to round up the amplitude value according to the number of unmodulated signals.

In an embodiment, the predistorter can further comprise an operation unit which gives the result obtained by performing a predetermined operation for a characteristic value of the envelope according to the mean power of the transmission signal or the result obtained by not performing said predetermined operation according to the mean power of the transmission signal, as the characteristic quantity to the reference value conversion unit 3.

In this case, when the characteristic value is the amplitude value of the envelope, and the mean power of a transmission signal is large, the operation unit converts the amplitude value into power, and when the mean power of the transmission signal is small, the operation unit converts the amplitude value into a dB value and gives the dB value to the reference value conversion unit 3, and when the given value is small, the reference value conversion unit 3 can round up the value to a predetermined value.

In an embodiment, when the characteristic quantity is both the amplitude value of the envelope and the time differential of the envelope or the value of time derivative, and the amplitude value is small, the reference value conversion unit 3 can round up that value to a predetermined value, and when the time differential or the absolute value of time derivative is large, the reference value conversion unit 3 can also round down that value to a predetermined absolute value or can convert that value into the value of the same code having a rounded-down absolute value.

In an embodiment, the predistorter can further comprise an operation unit which outputs the result obtained by performing a certain operation for the value of envelope amplitude of a transmission signal according to the mean power of the transmission signal or the result obtained by not performing said operation, and the characteristic quantity is both the output result of the operation unit and the time differential of the envelope value or the value of time derivative, and when the output value of the operation unit is small, the reference value conversion unit 3 can round up that value to a predetermined value, and/or when the time differential or the absolute value of time derivative is large, the reference value conversion unit 3 can also round down that value to a predetermined absolute value.

In this case, when the mean power of the transmission signal is large, the operation unit converts the amplitude value of the envelope into power, and when the mean power of the transmission signal is small, the operation unit can convert the amplitude value of the envelope to a dB value.

In an embodiment, the predistorter can further comprise an operation unit which obtains a first characteristic quantity as the result obtained by performing a predetermined operation for the amplitude value of the envelope according to the mean power of the transmission signal or the result obtained by not performing said operation, and the time differential of the first characteristic quantity or a second characteristic quantity as the value of time derivative, and when the value of the first characteristic quantity is small, the reference value conversion unit 3 can round up that value to a predetermined value, and when the absolute value of the second characteristic quantity is large, the reference value conversion unit 3 can also round down that value to a predetermined absolute value.

In this case, when the mean power of the transmission signal is large, the operation unit can convert the amplitude value of the envelope into power and when the mean power of the transmission signal is small, the operation unit can convert the amplitude value of the envelope into a dB value.

In an embodiment, the predistorter can further comprise an operation unit which obtains a first characteristic quantity as the result obtained by performing a first predetermined operation for the amplitude value of the envelope according to the mean power of the transmission signal or the result obtained by not performing said operation, and a second characteristic quantity as the result obtained by performing a second predetermined operation for the time differential of the envelope or the value of time derivative, or the result obtained by not performing said operation, and when the first characteristic quantity is small, the reference value conversion unit 3 rounds up the quantity to a predetermined value, and/or when the absolute value of second characteristic quantity is large, the reference value conversion unit 3 can also round down that value to a predetermined value.

In this case, when the mean power of the transmission signal is large, the operation unit can convert the transmission signal into power as the first operation or/and the second operation, and when the mean power of the transmission signal is small, the operation unit can convert the transmission signal into a dB value as the first operation or/and the second operation.

According the embodiments, when the amplitude value of the envelope, for example, of a transmission signal is small, the value is rounded up to a predetermined value, and when the time differential of the value of the envelope or the absolute value of time derivative is large, the absolute value of that value is rounded down to a predetermined value, and is used as a reference value of the distortion compensation coefficient table.

BRIEF DESCRIPTION OF THE DRAWINGS

FIG. 21 shows the expression of the original signal shown in FIG. 20 on the IQ plane.

FIG. 25 shows the spike-shaped error which emerges at the position in which the emergence frequency is small.

DETAILED DESCRIPTION OF THE PREFERRED EMBODIMENTS

Figure 1:
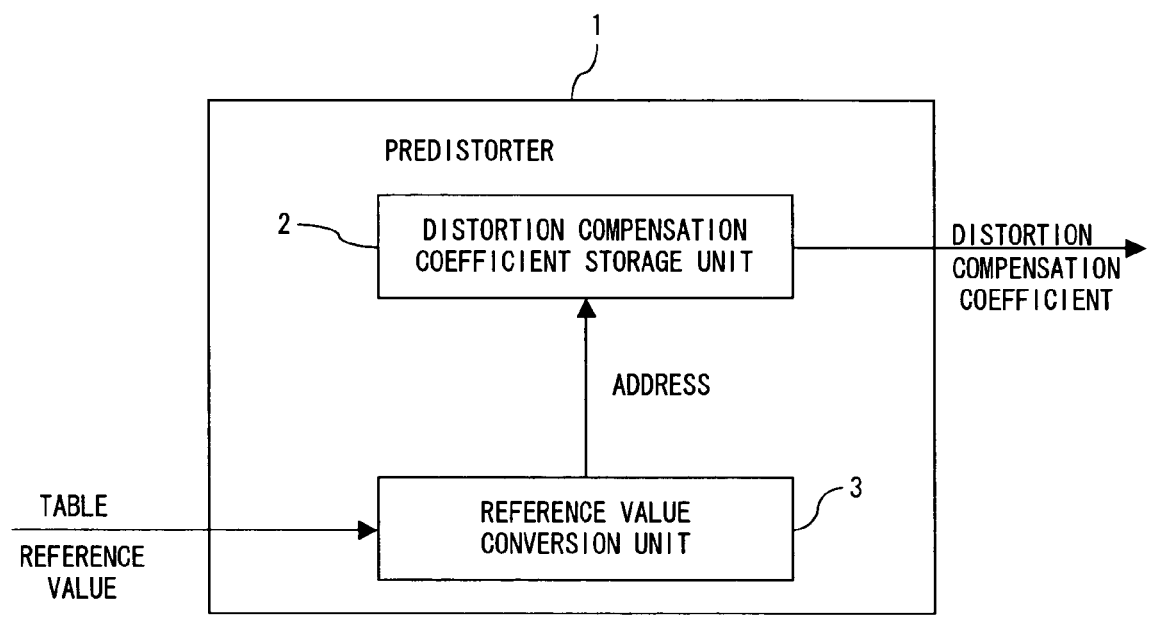
FIG. 1 is a block diagram showing the configuration of the principle of the predistorter of the present invention.
Figure 2:
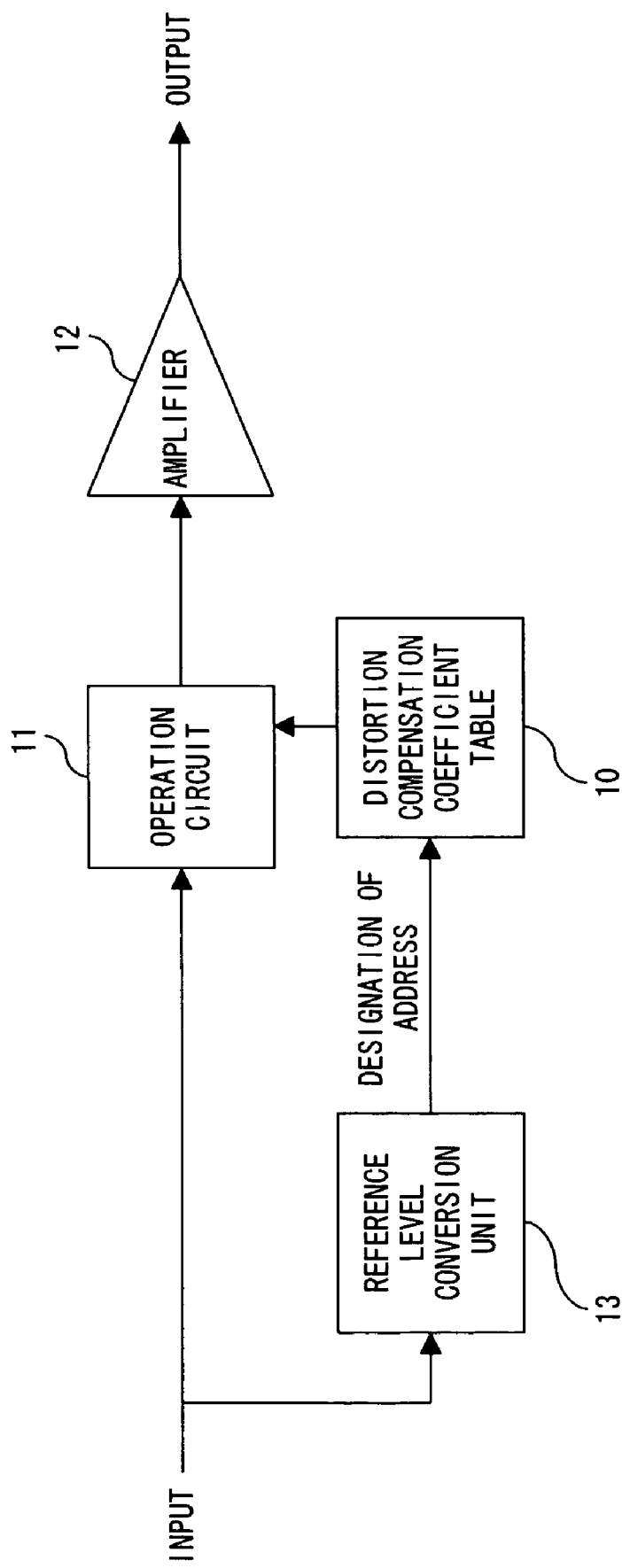
FIG. 2 is a basic explanatory drawing of the predistortion method of the present invention.

FIG. 2 is a basic explanatory drawing of the predistortion method of the present invention. In FIG. 2, the operation for which a distortion compensation coefficient in the distortion compensation coefficient table 10 is used according to the characteristic quantity of the input is performed for the input of an amplifier by the operation circuit 11, and the output of the operation circuit 11 is given to the amplifier 12 and it becomes a transmission output signal.

It is characteristic of the present invention that as the address to be designated when reference is made to the distortion compensation coefficient table 10, the characteristic quantity of the input as it is is not used, but the conversion in which, for example, the address as a reference level is rounded up or rounded down by the reference level conversion unit 13 is conducted, and as the result of the conversion, reference is made to the distortion compensation coefficient table 10 by the designated address.

Figure 3:
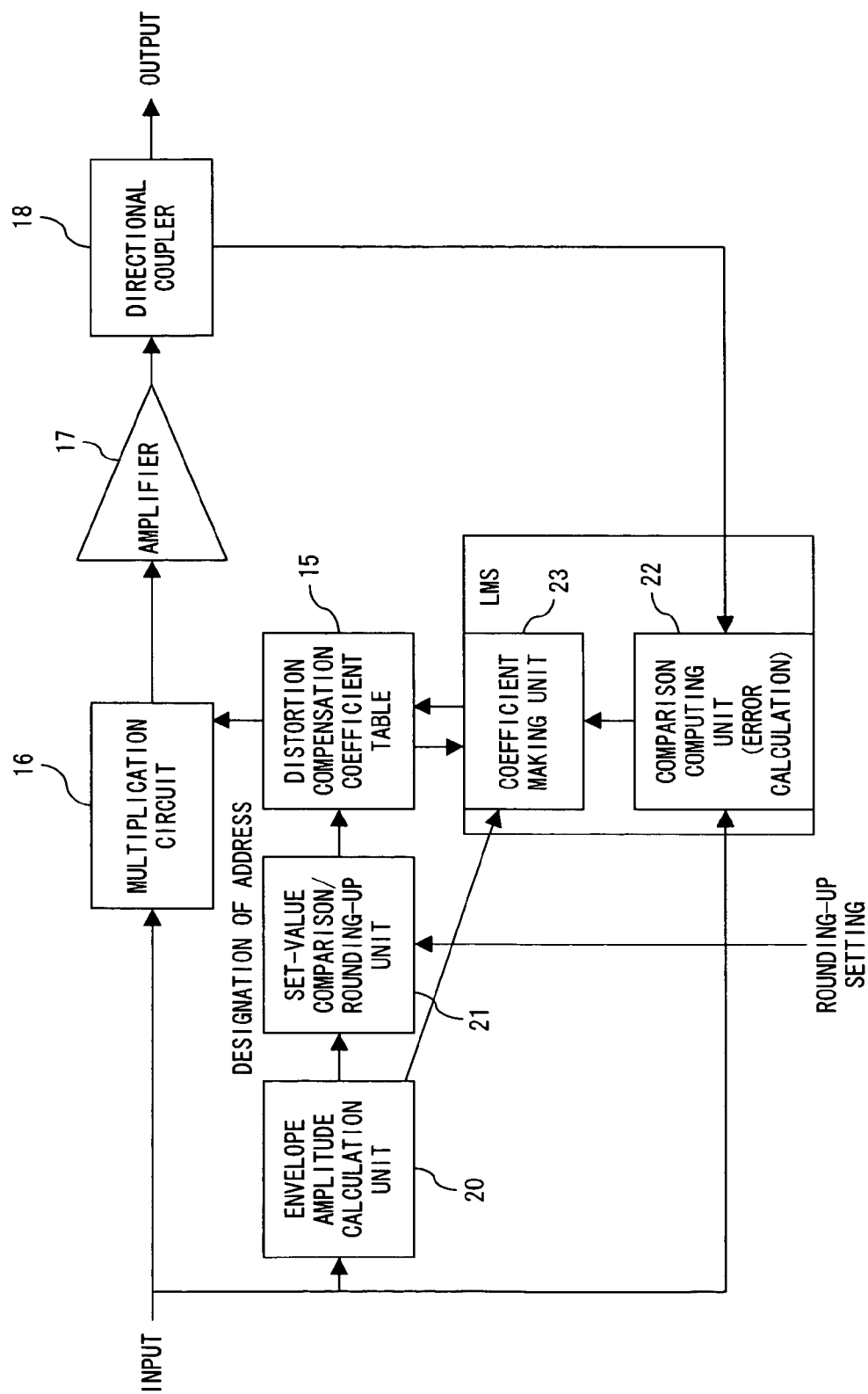
FIG. 3 shows the predistortion method in a first embodiment.

FIG. 3 shows the predistortion method in a first embodiment. In FIG. 3, in the same way as in FIG. 2, the distortion compensation coefficient and the input signal stored in the distortion compensation coefficient table 15 are multiplied by the multiplication circuit 16, and the multiplication result is given to the amplifier 17, and the output of the amplifier 17 becomes a transmission output signal via the directional coupler 18.

The input signal and part of the transmission output signal, i.e. part of the output of the directional coupler 18 are compared by the comparison computing unit 22, and errors are calculated, and the storage contents of the distortion compensation coefficient table 15 are updated by the coefficient making unit 23, for example, by using the LMS algorithm.

The update of a distortion compensation coefficient using this LMS algorithm is described in detail in the following prior application of the applicant.

Document 4: International publication Wo 01/08320 A1 "Distortion Compensation Method and Distortion Compensation Apparatus of Radio Equipment".

Figure 18:
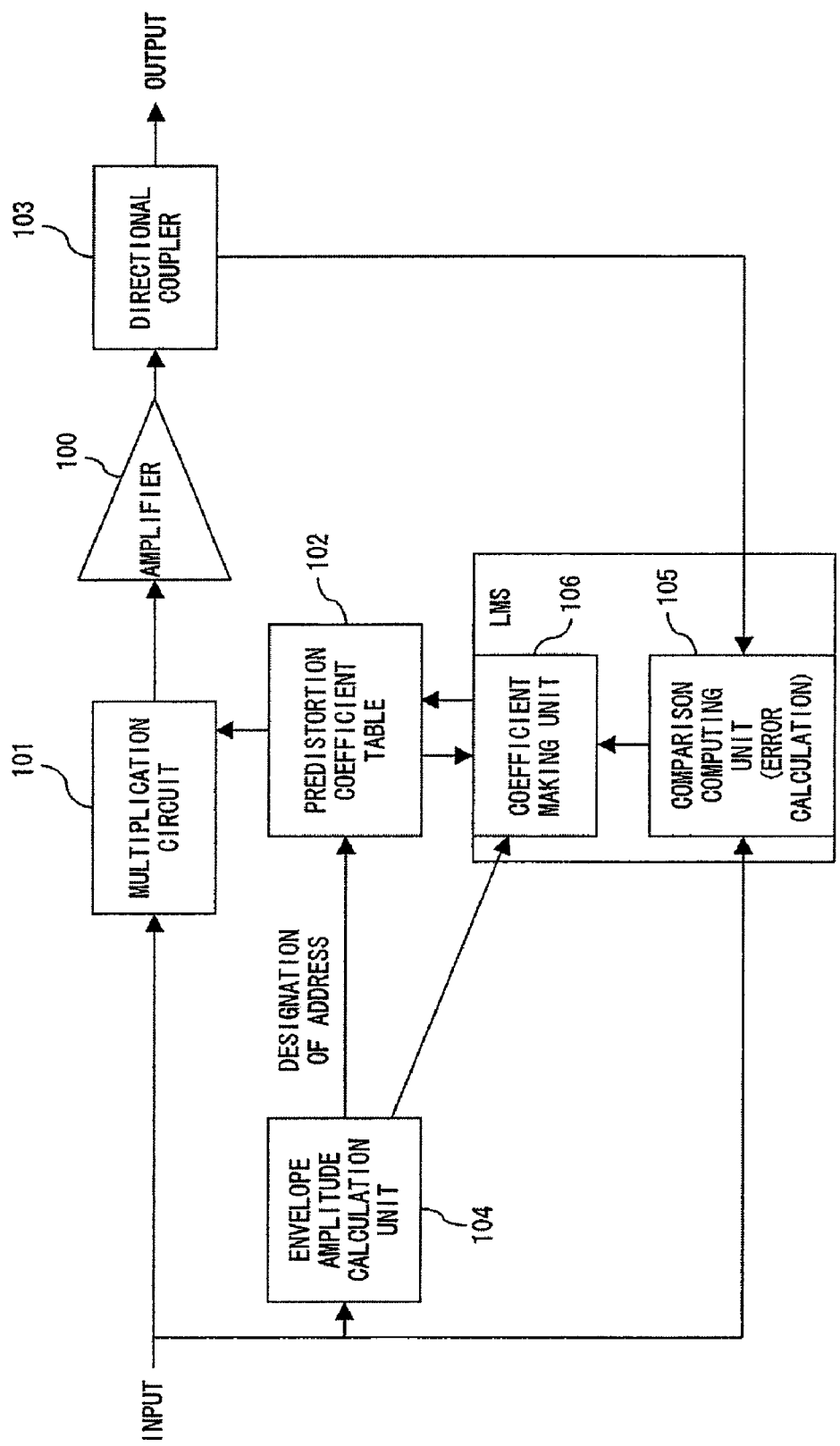
FIG. 18 is a block diagram showing a first configuration of a transmitter using a predistorter in prior art.
Figure 22:
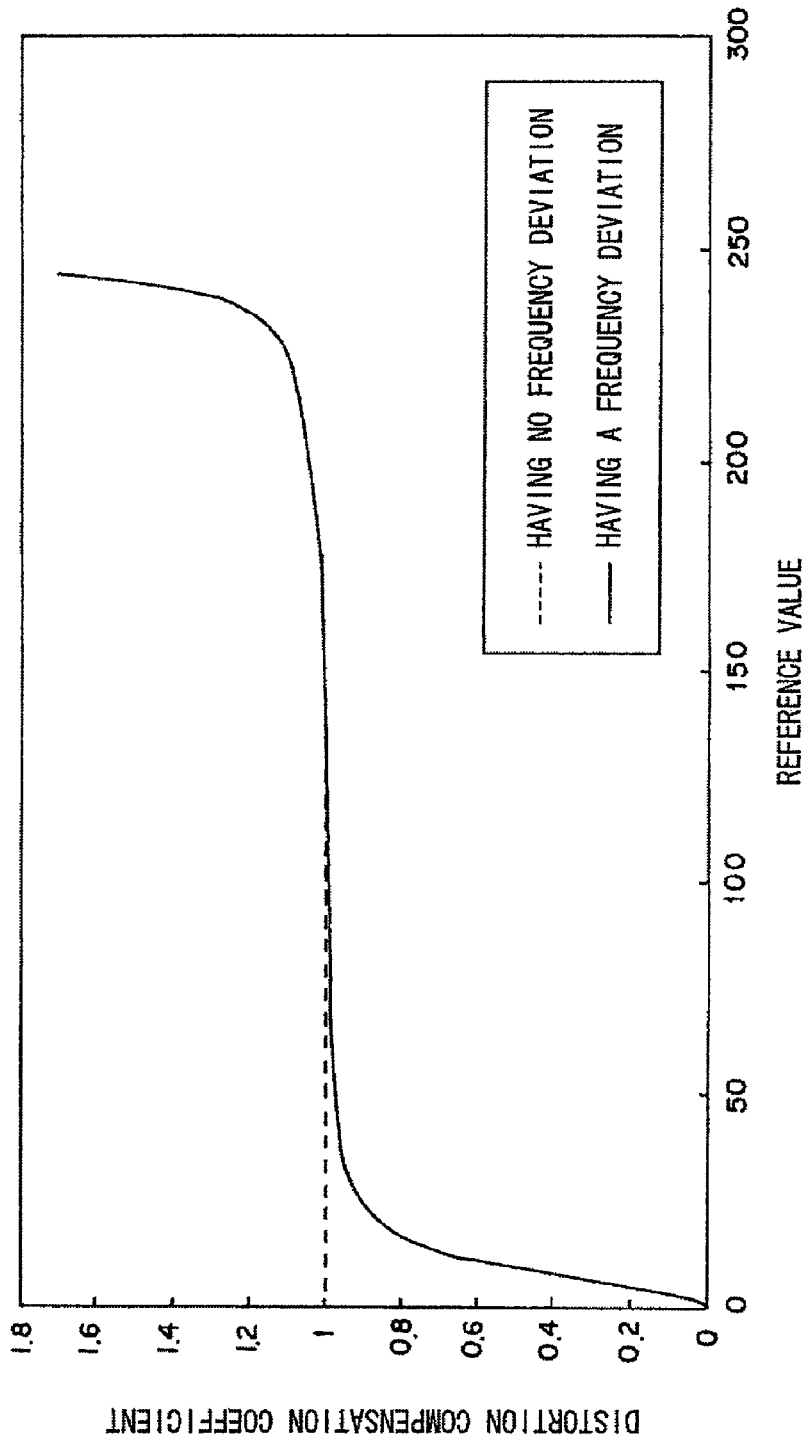
FIG. 22 shows the distortion compensation coefficient both when a frequency amplitude deviation exists and when no frequency amplitude deviation exists.
Figure 23:
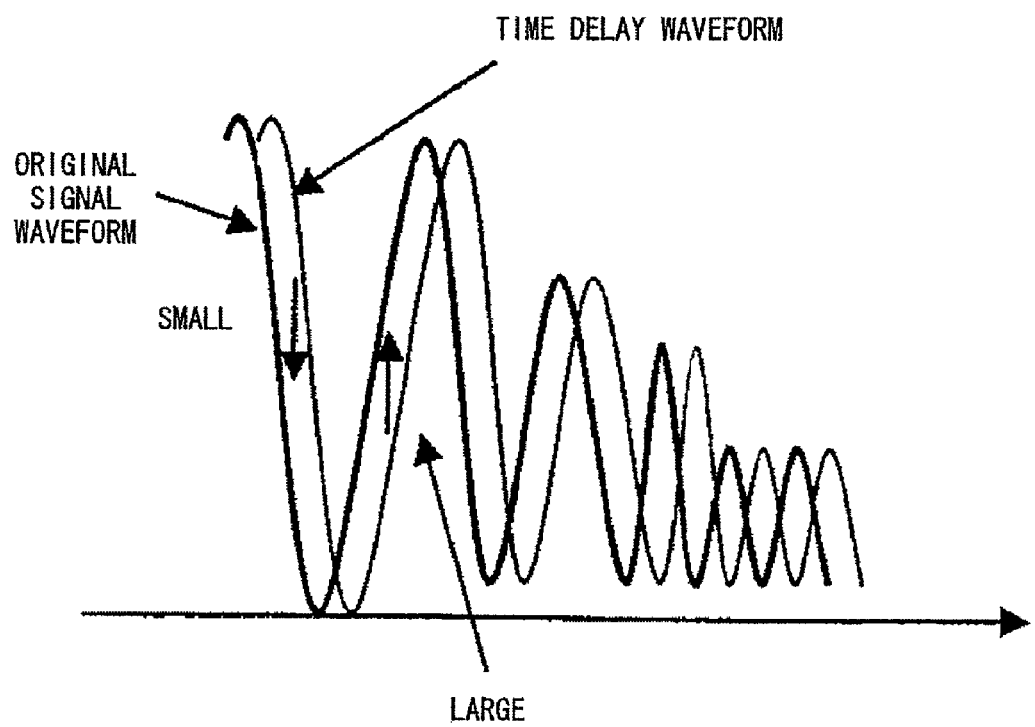
FIG. 23 shows the waveforms of an original signal and an output signal of an amplifier.

In FIG. 3, basically, the amplitude of the envelope of the input signal is calculated by the envelope amplitude calculation unit 20 in the same way as in FIG. 18, but the calculation result of the amplitude as it is is not used as the address for referring to the distortion compensation coefficient table 15; the calculated amplitude value is rounded up by the set-value comparison/rounding-up unit 21 to a predetermined value, for example, a value having no influence of a frequency amplitude deviation close to an input value within a linear range of the amplifier, for example, the reference value of about 100 shown in FIG. 22; the rounded-up value is used as the address for referring to the distortion compensation coefficient table 15; and the distortion compensation coefficient stored in that address is given to the multiplication circuit 16.

As the method for determining the rounding-up set value of the reference value, in addition to the method for setting a reference value to the input value having no influence of the frequency amplitude deviation, a method is also considered in which the input and output characteristics of the amplifier are examined and the reference value is set to the upper-limit value within a linear range, or the reference value is set to the input value which is lowered by 20 dB from the saturation level of the amplifier.

Figure 4:
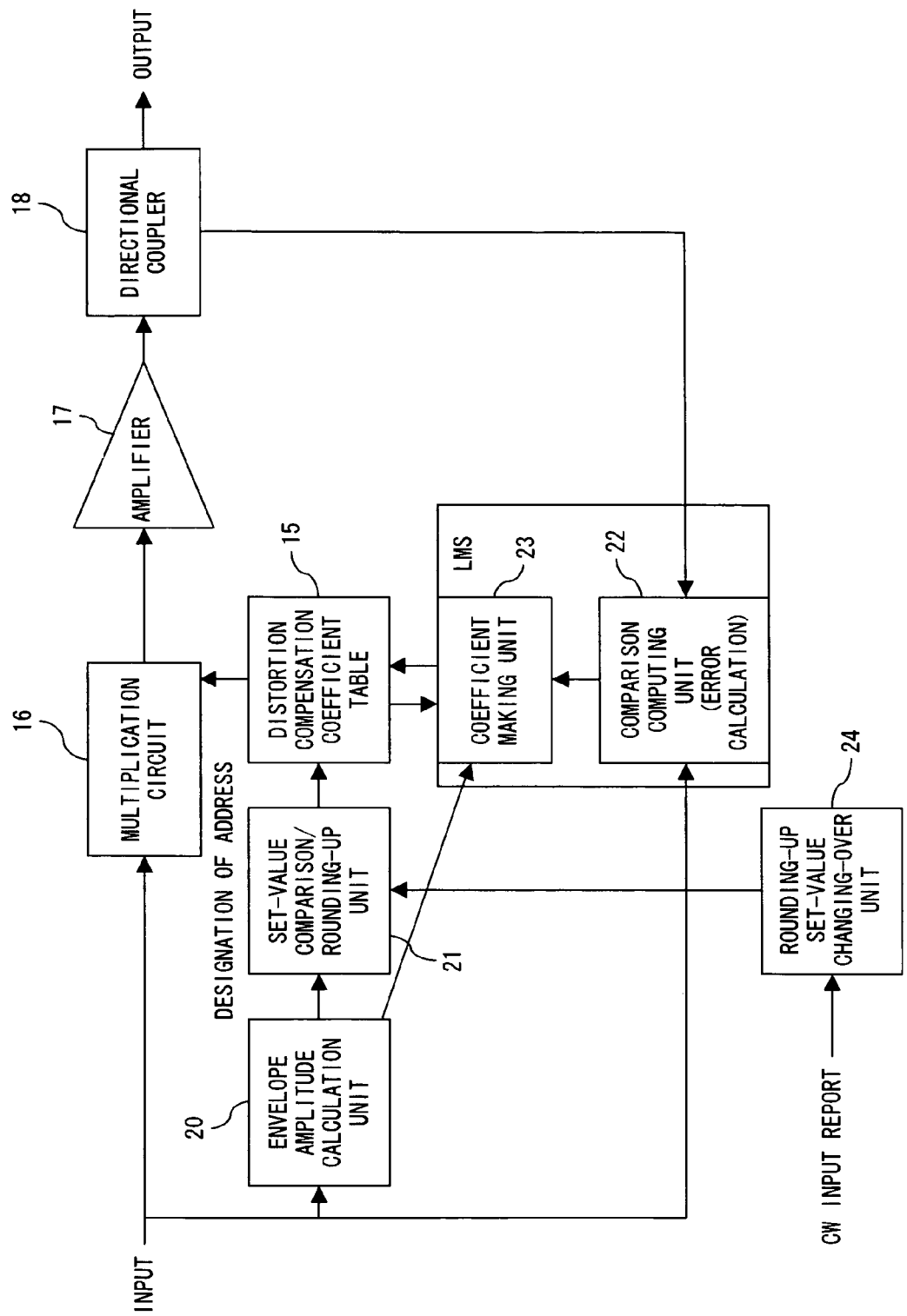
FIG. 4 shows the operation when there is an unmodulated signal in an input signal in a first embodiment.

FIG. 4 shows the operation when there is an unmodulated signal in an input signal in a first embodiment. When multi-carrier signals are transmitted, and there is an unmodulated signal (a continuous wave (CW) signal) in the multi-carrier signals, since the envelope amplitude value of the unmodulated signal takes a specific value, the rounded-up level is all the more increased, that is to say, for example, the envelope amplitude value of the CW signal as it is needs to be added. When it is detected by the detection unit (not shown in FIG. 4) that the unmodulated signal has been inputted, a rounded-up set value given to the set-value comparison/rounding-up unit 21 is changed over by the rounding-up set-value changing-over unit 24.

Figure 5:
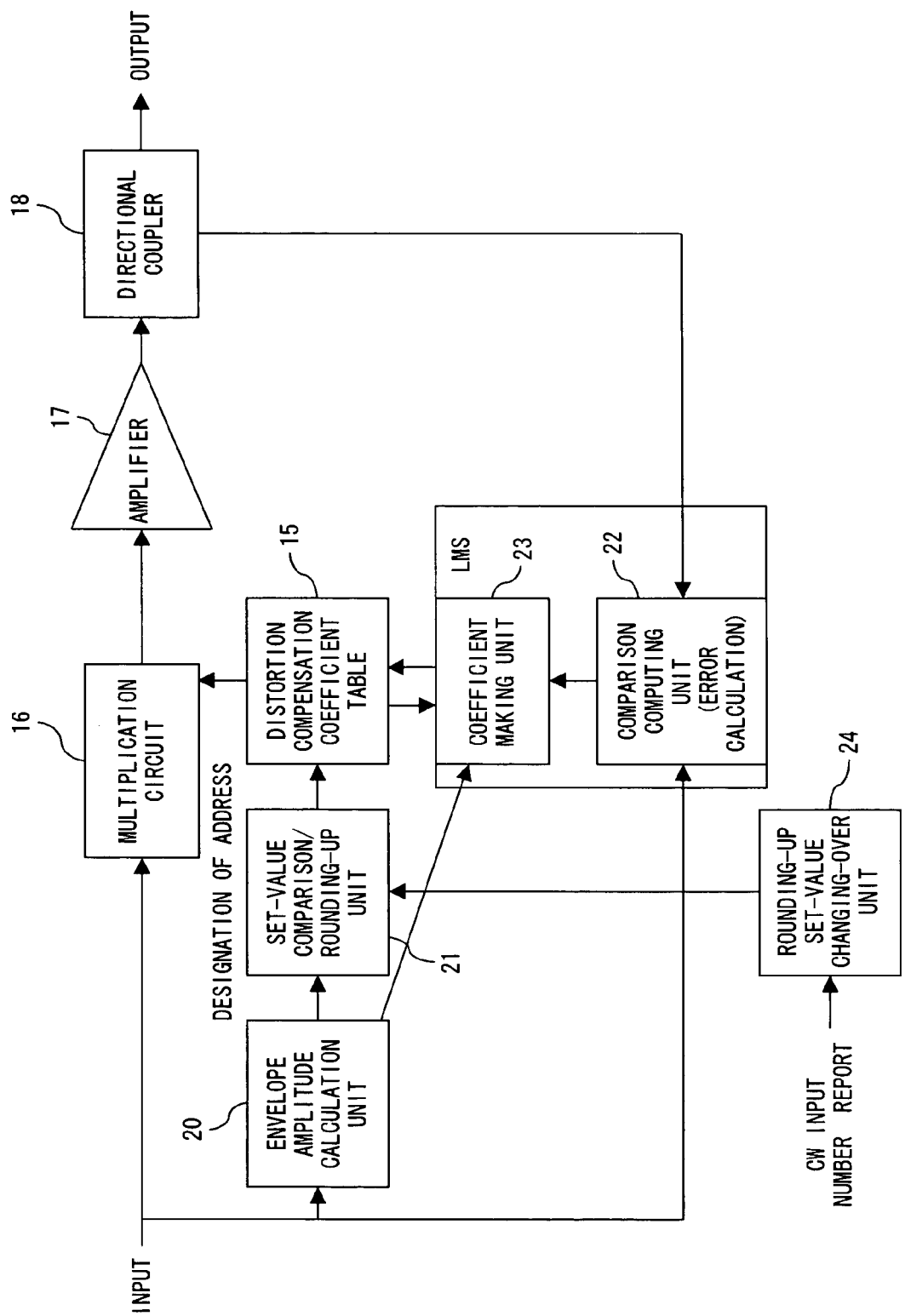
FIG. 5 shows the operation of changing over the set value for rounding upwards according to the number of inputs of unmodulated signals.

FIG. 5 shows the operation of changing over the set value for rounding upwards according to the number of inputs of unmodulated signals in the first embodiment. When the number of unmodulated signals increases when multi-carrier signals are transmitted and the level of each unmodulated signal differs, the beat signal of the unmodulated signal, for example, the amplitude of an offset sine wave in the case of two waves is obtained, and the rounded-up value must be raised by that value. Then, the rounding-up set value is changed over by the rounding-up set-value changing-over unit 24 according to the result of the detection of the number of inputs of unmodulated signals, and is given to the set-value comparison/rounding-up unit 21.

Figure 6:
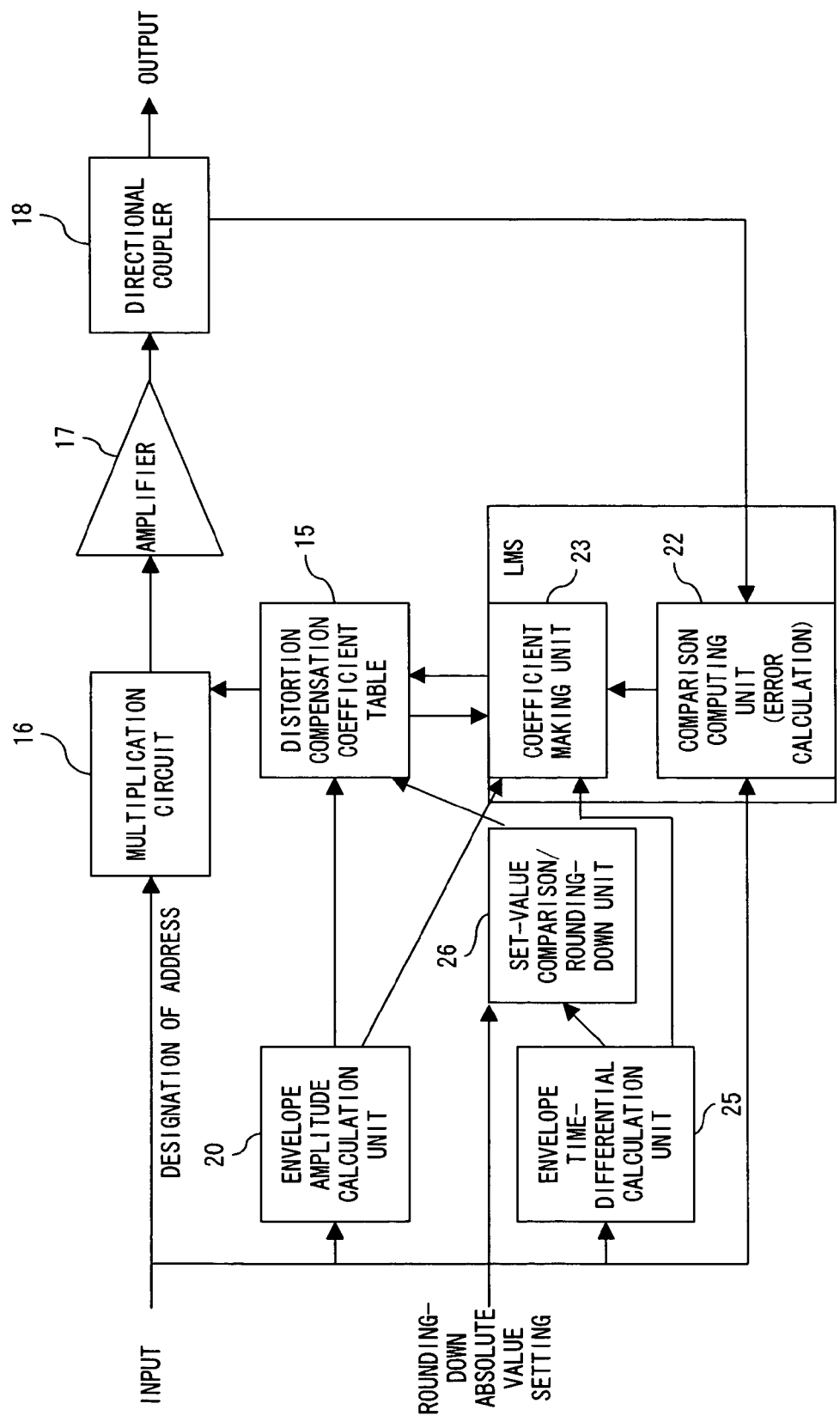
FIG. 6 shows the predistortion method in a second embodiment.
Figure 19:
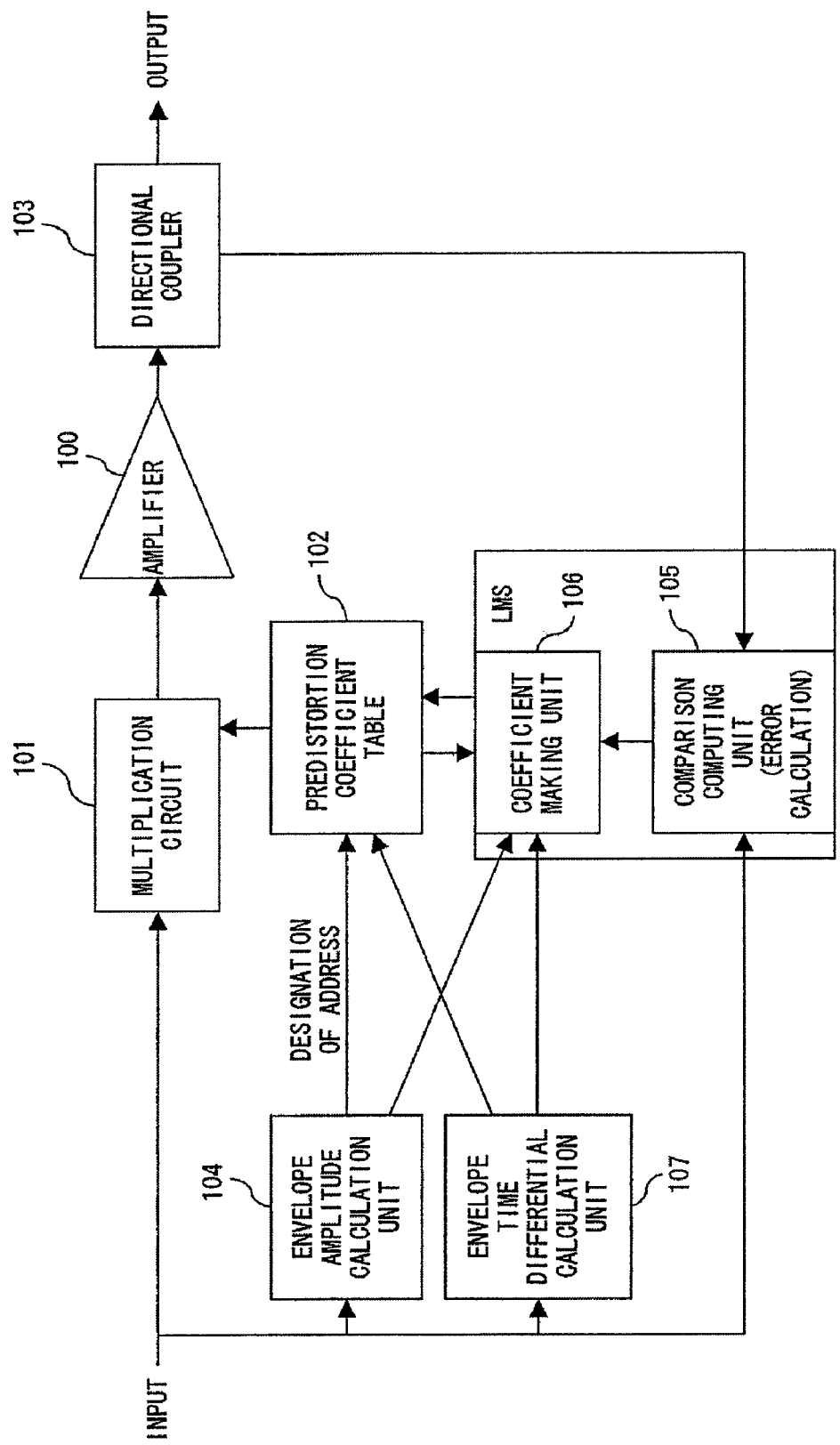
FIG. 19 is a block diagram showing a second configuration of a transmitter using a predistorter in prior art.
Figure 20:
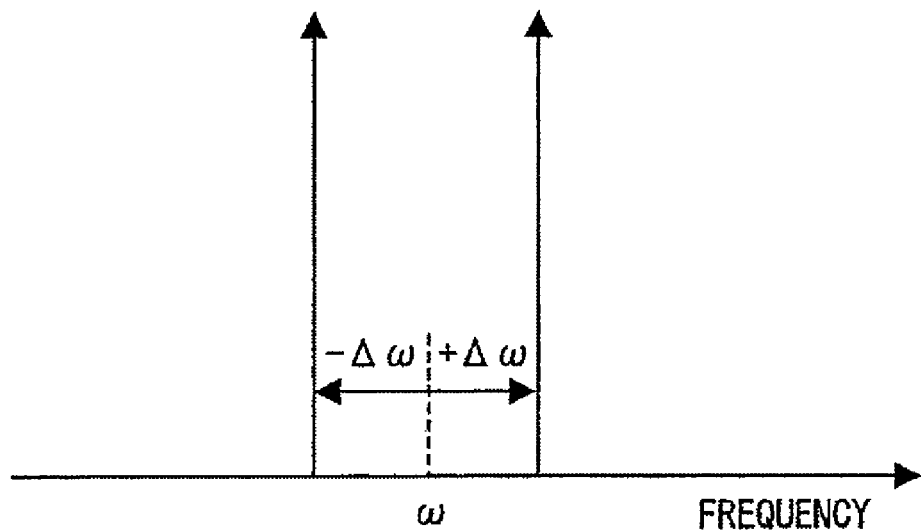
FIG. 20 shows two unmodlated signals.
Figure 2:
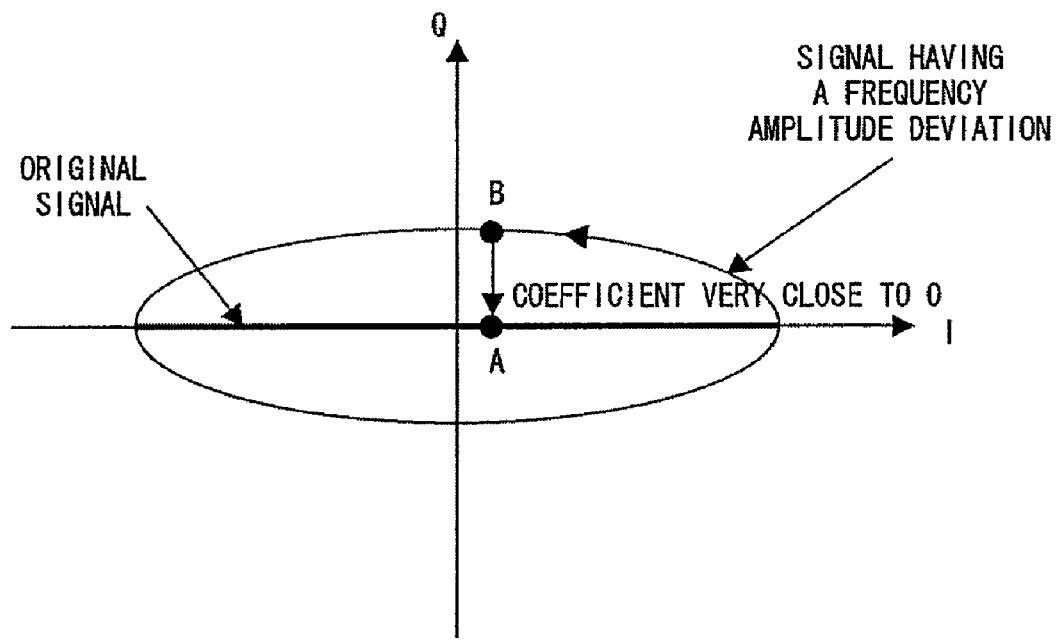

FIG. 6 shows the predistortion method in a second embodiment. In FIG. 6, in the same way as the second conventional example described in FIG. 19, reference is made to the distortion compensation coefficient table using both the envelope amplitude value and the time differential of the envelope value as an address, but in FIG. 6, the comparison rounding-up unit 26 is provided between the envelope time-differential calculation unit 25 and the distortion compensation coefficient table 15.

Figure 24:
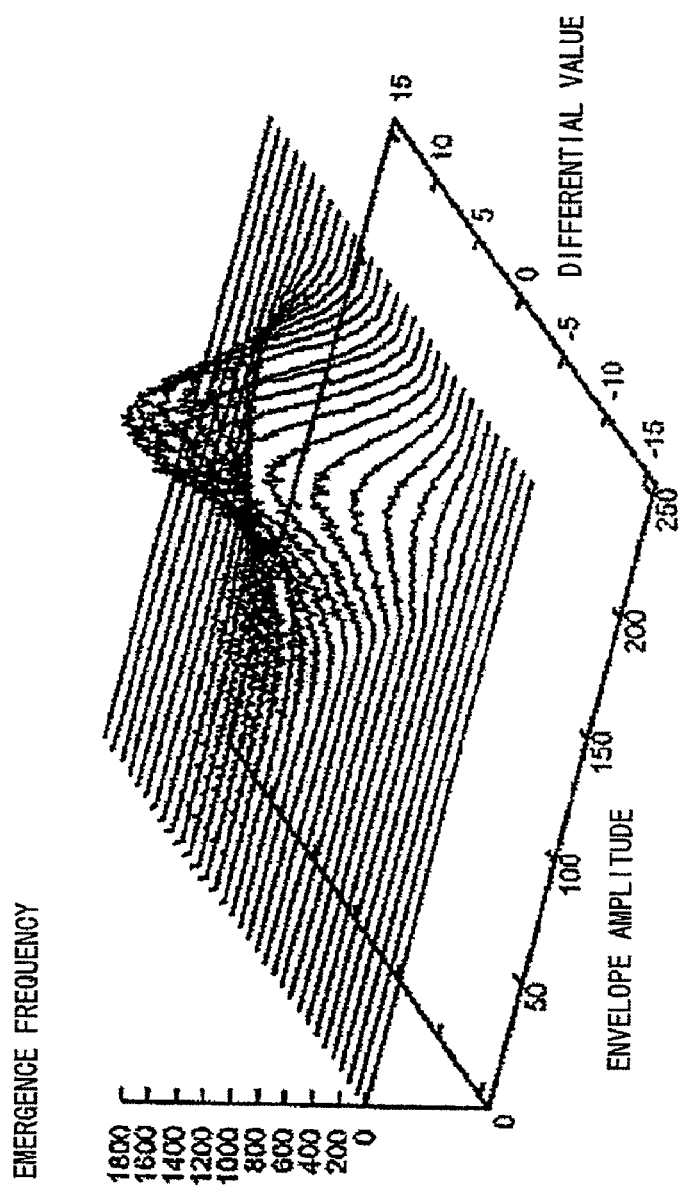
FIG. 24 shows the emergence frequency of the value of time differential and the amplitude value of the envelope.
Figure 2:
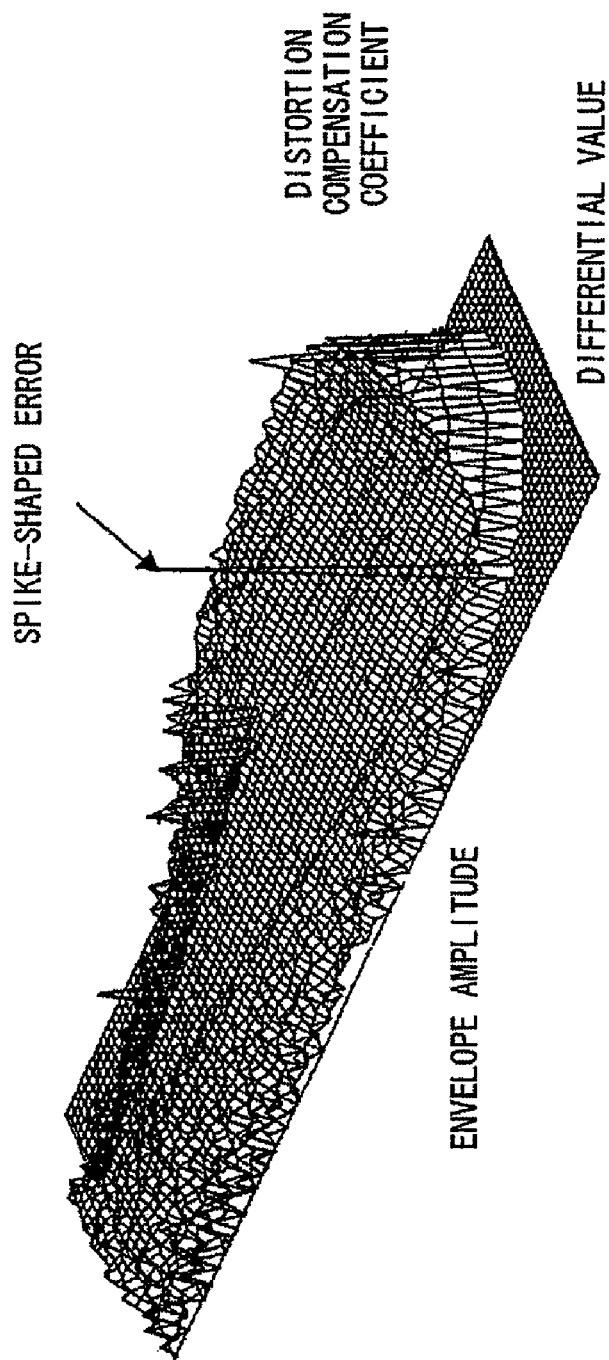

Then, the absolute value of the envelope time differential is compared with the set value set in advance. In the region where the absolute value of the envelope time differential is large as described in FIG. 24 and FIG. 25, and a spike-shaped distortion compensation coefficient emerges because the emergence frequency is small, the distortion compensation coefficient whose the range of an absolute value is smaller is used, so the absolute value of the envelope time differential is rounded down, and the rounded-down value is used as the reference value of the distortion compensation coefficient table 15.

As the method of setting this rounded-down absolute value, the range of an absolute value in which the deterioration of the performance of the amplifier does not occur due to such an error as described in FIG. 25 is examined by cut-and-try, and the absolute value is set so that it is rounded down to that range.

Figure 7:
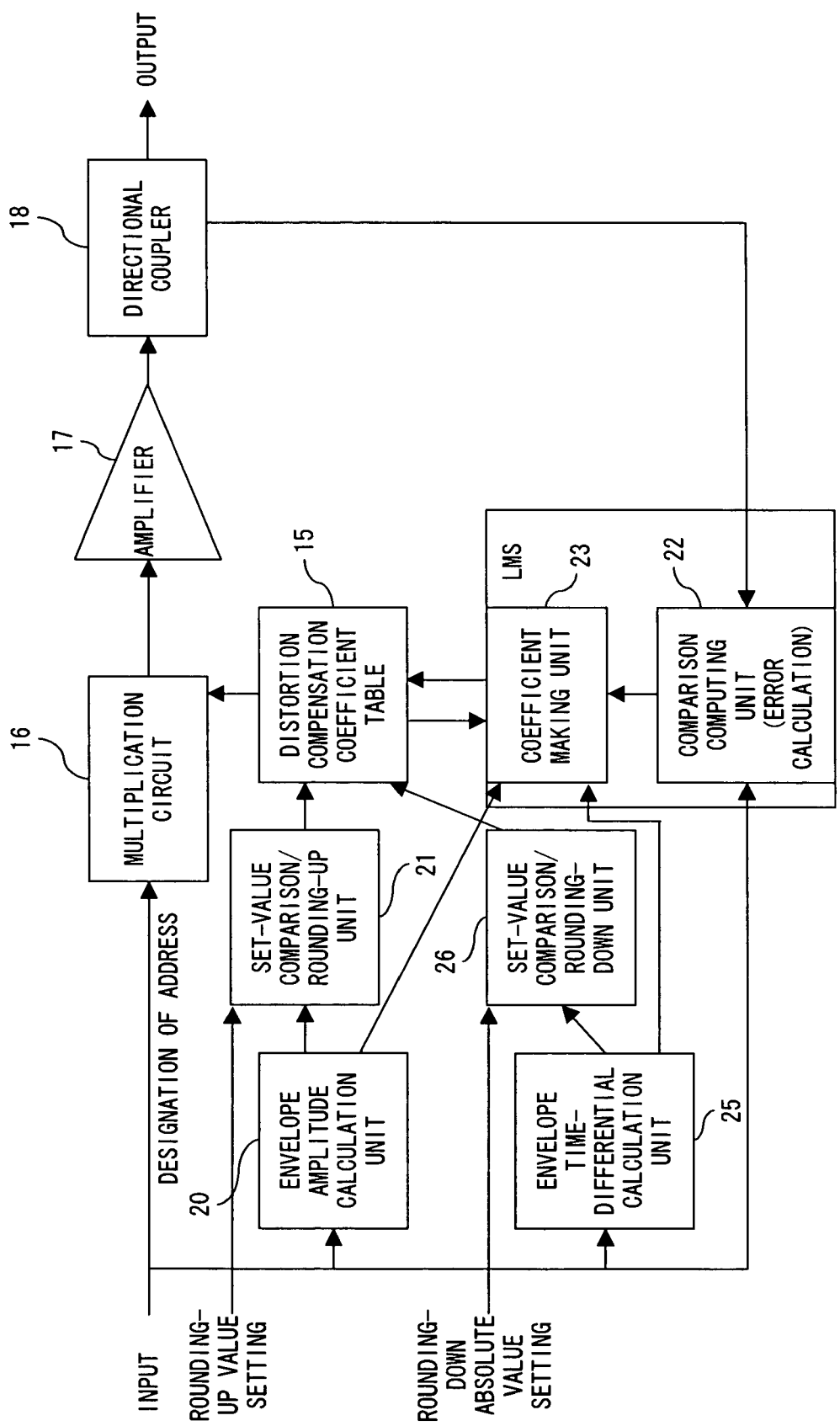
FIG. 7 shows the predistortion method in a third embodiment.

FIG. 7 shows the predistortion method in a third embodiment. In the third embodiment, the operation in the first embodiment and the operation in the second embodiment are performed alternatively or simultaneously.

In other words, in FIG. 7, the comparison rounding-up unit 21 is provided between the envelope amplitude calculation unit 20 and the distortion compensation coefficient table 15, and the set-value comparison rounding-down unit 26 is provided between the envelope time-differential calculation unit 25 and the distortion compensation coefficient table 15.

Then, when the amplitude value calculated by the envelope amplitude calculation unit 20 is smaller than the set rounded-up value, the reference value, namely the reference address of the distortion compensation coefficient table 15, is rounded up to the set rounded-up value. When the absolute value of the time differential calculated by the envelope time-differential calculation unit 25 is larger than the set rounded-down absolute value, said absolute value of time differential is rounded down to the set rounded-down value by the set-value comparison rounding-down unit 26. The result obtained thereby is given as the reference address to the distortion compensation coefficient table 15. In short, when the absolute value of time differential is large, the reference value has a small absolute value which is set in advance, and reference is made to the table using the original time differential and the value of the same code as the reference address.

Figure 8:
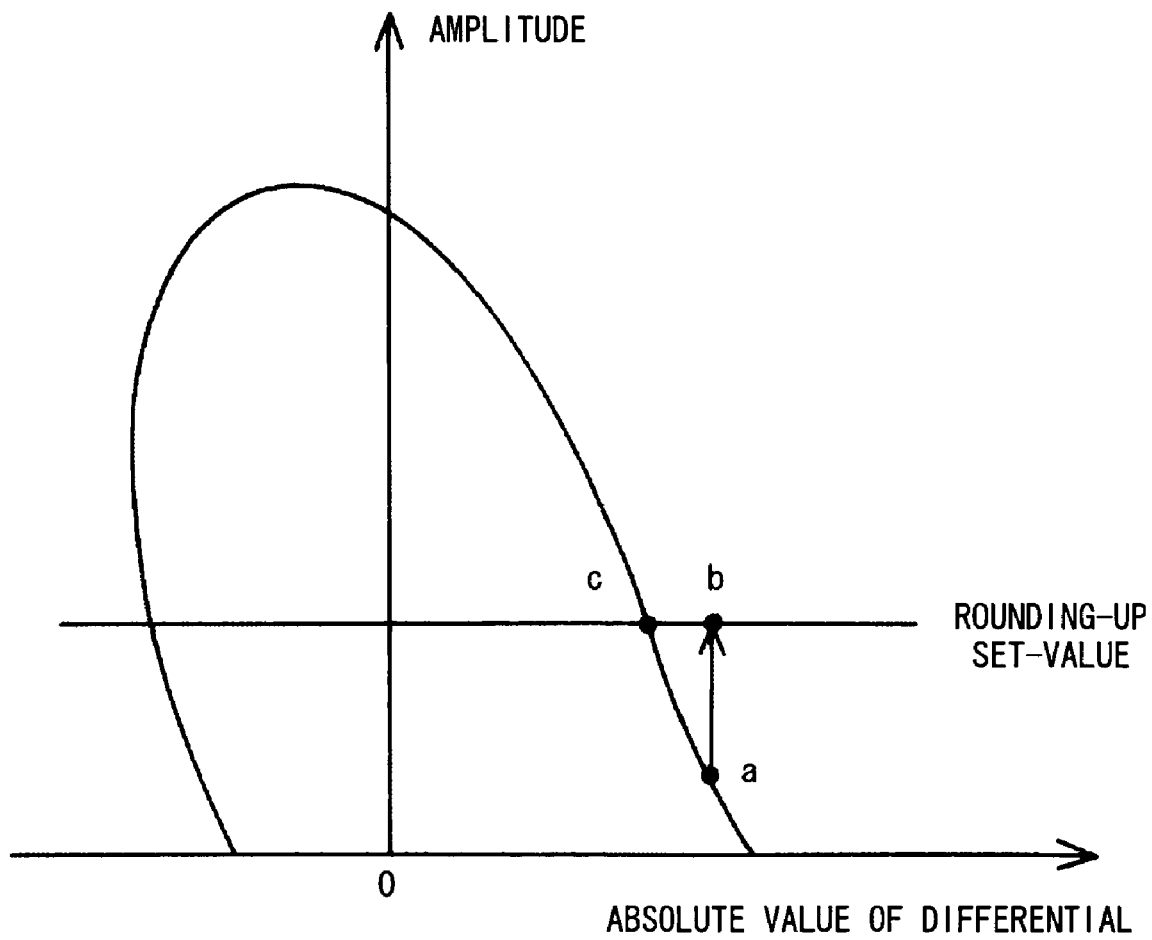
FIG. 8 shows an instance in which both rounding up the amplitude value of the envelope and rounding down the absolute value of time differential are used in a third embodiment.

When both of the amplitude value of the envelope and the absolute value of time differential are used or when either of them is used, the absolute value of time differential cannot be sometimes obtained by rounding up the reference address as the envelope amplitude value. FIG. 8 is a drawing to explain such a case.

In FIG. 8, if the reference value corresponding to the amplitude value is rounded up to point b which is determined by a rounded-up set value because the amplitude value at point a is small, since the inside of the half ellipse shown in FIG. 8 is within the range in which the amplitude vale and the absolute value of time differential exist, the value of time differential must be also rounded down to point c. In this case, both rounding down the envelope amplitude value and rounding down the absolute value of time differential must be applied.

Figure 9:
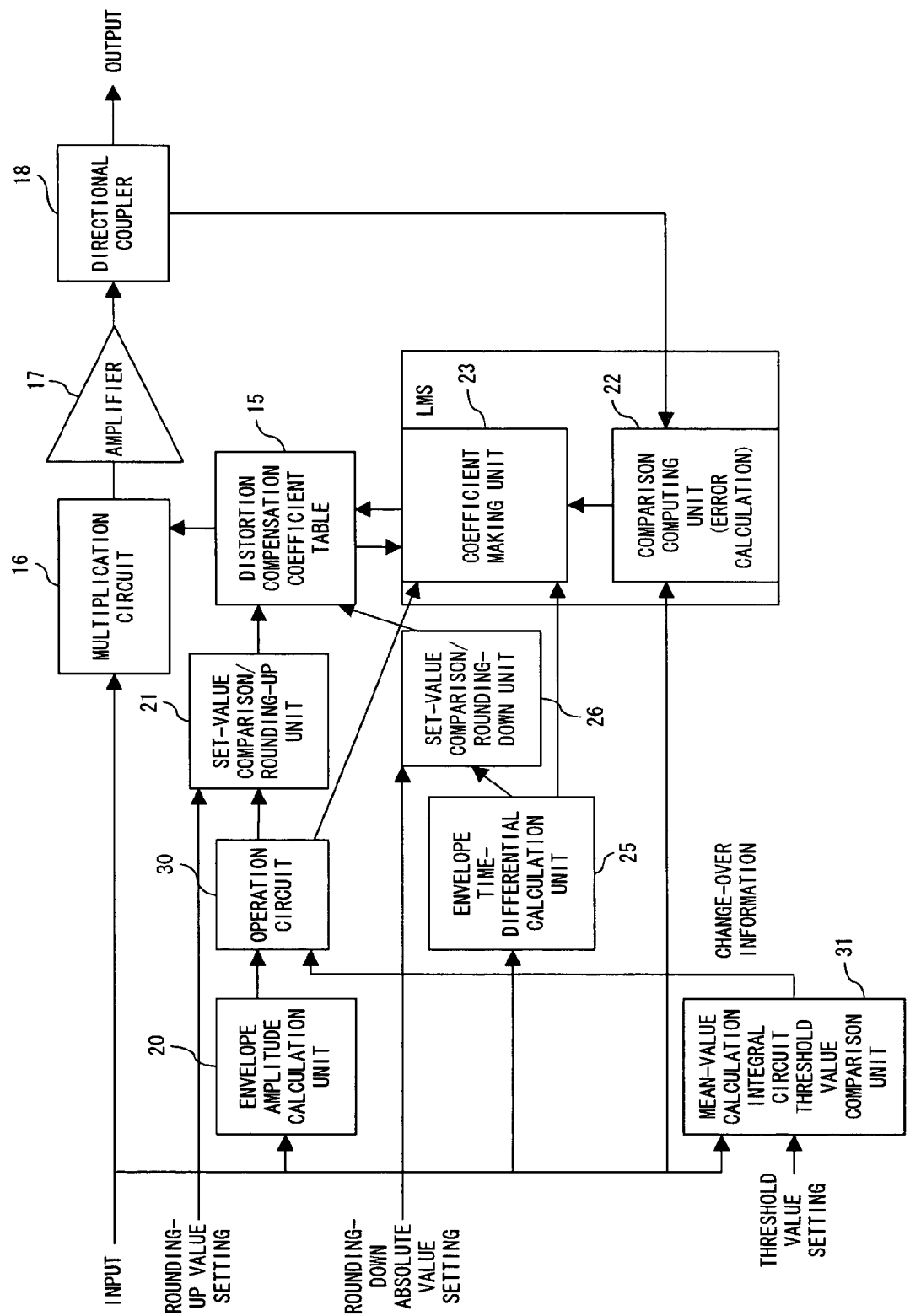
FIG. 9 shows the predistortion method in a fourth embodiment.

FIG. 9 shows the predistortion method in a fourth embodiment. In the fourth embodiment, in the same way as in the third embodiment, rounding up the envelope amplitude value and rounding down the absolute value of envelope time differential are conducted as occasion demands. What differs from FIG. 7 is that the operation circuit 30 is provided between the envelope amplitude calculation unit 20 and the set-value comparison/rounding-up unit 21, and operation is performed for the envelope amplitude value by the operation circuit 30 according to the value of mean power of the input signal, and the calculation result is given to the set-value comparison/rounding-up unit 21.

In this case, the mean power of the input signal is obtained by a mean-value calculation integral circuit threshold comparison unit 31; said mean power is compared with a preset threshold; change-over information is given to the operation circuit 30 according to the result obtained thereby; operation is performed by the operation circuit 30, and whether operation is performed for the calculation result of the amplitude value or whether the calculation result of the envelope amplitude calculation unit 20 is through given to the set-value comparison/rounding-up unit 21 is changed over.

Figure 10:
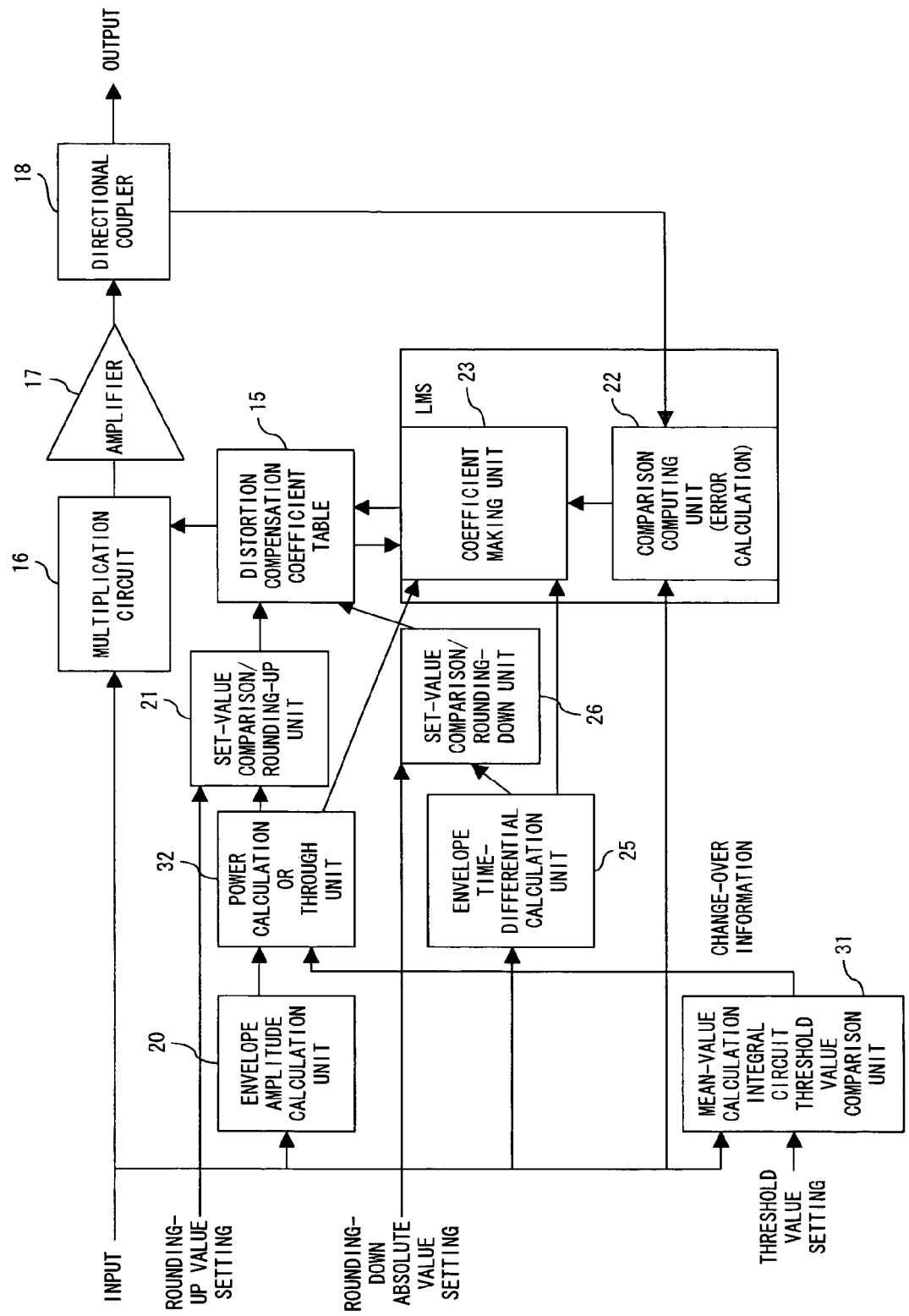
FIG. 10 shows a first example of operation in a fourth embodiment.

FIG. 10 shows a first example of operation in a fourth embodiment. In FIG. 10, power calculation or the through unit 32 is used as a concrete example of the operation circuit 30 shown in FIG. 9, and power conversion of the envelope amplitude value as the calculation result of the envelope amplitude calculation unit 20 is carried out, and the conversion result is given to the set-value comparison/rounding-up unit 21.

Basically, by squaring the envelope amplitude value and converting it into a power value, the resolution of the part in which the envelope amplitude value is large can be improved, so when it is judged by the mean-value calculation integral circuit threshold comparison unit 31 that the mean power of the signal is larger than the threshold in which the mean power of the signal is large and in which power calculation is conducted by the power calculation or a trough unit 32, change-over information to conduct the power calculation is given to the power calculation or the through unit 32.

Figure 11:
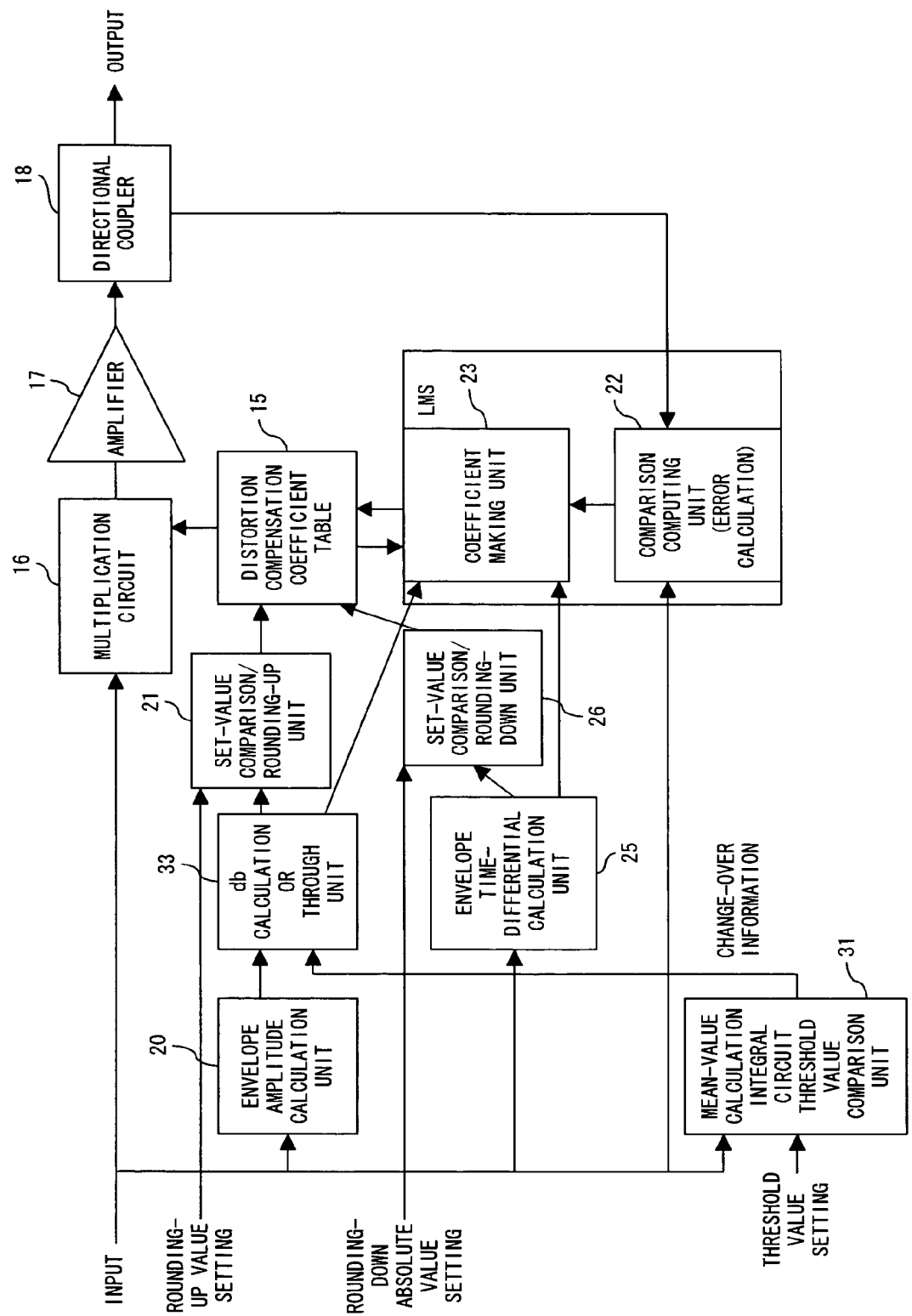
FIG. 11 shows a second example of operation in a fourth embodiment.

FIG. 11 shows a second example of operation in a fourth embodiment. In FIG. 11, a dB calculation or the through unit 33 is provided between the envelope amplitude calculation unit 20 and the set-value comparison/rounding-up unit 21. By converting the envelope amplitude value into a dB value, the resolution in the part in which the envelope amplitude value is small can be improved, so when the mean power of the signal is small, the envelope amplitude value is converted to a dB value by the dB calculation or the through unit 33, and the conversion result is given to the set-value comparison/rounding-up unit 21.

Figure 12:
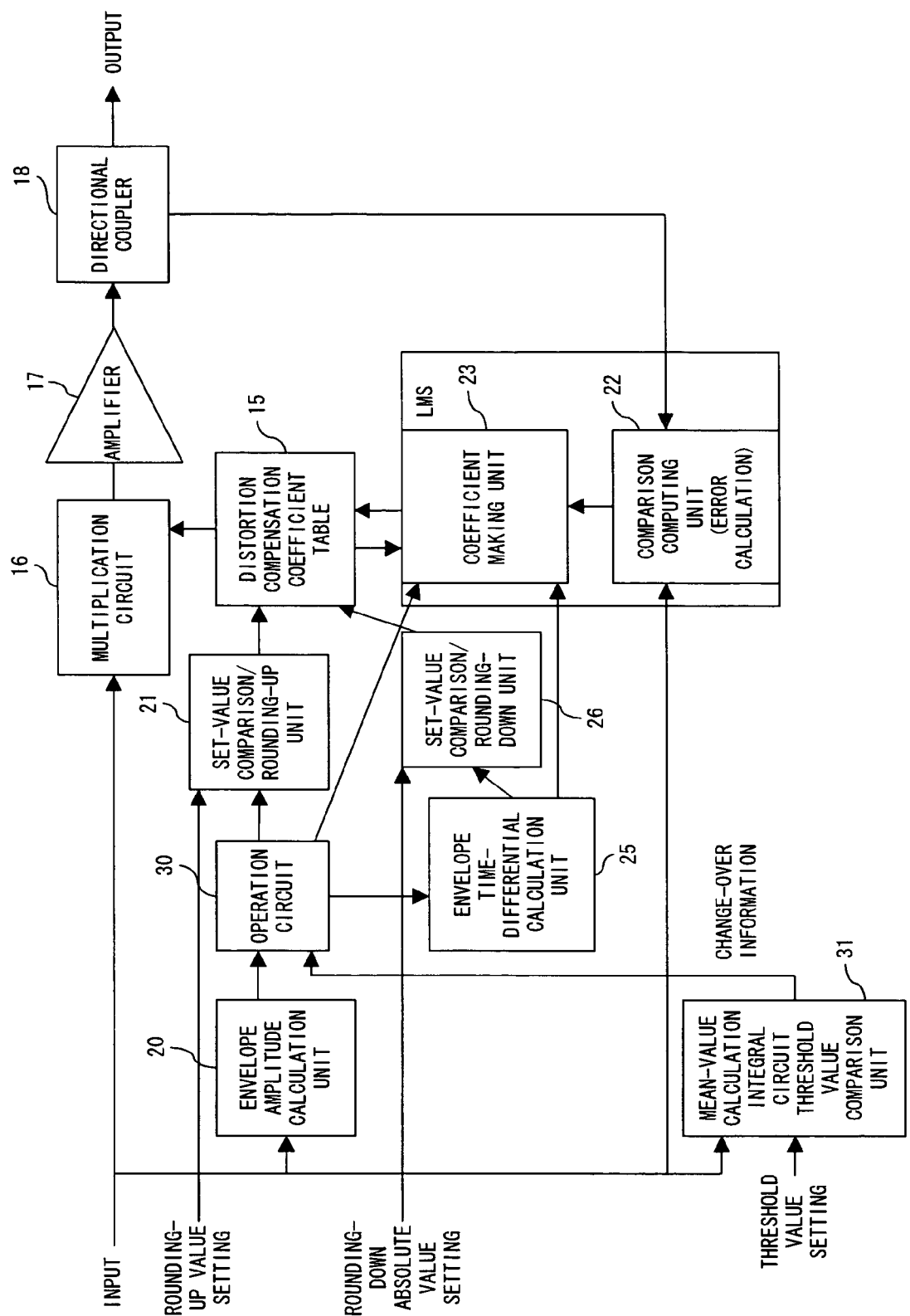
FIG. 12 shows the predistortion method in a fifth embodiment.

FIG. 12 shows the predistortion method in a fifth embodiment. In the fifth embodiment, in the same way as in the third embodiment, rounding up the envelope amplitude value and rounding down the absolute value of envelope time differential are conducted as occasion demands, and reference is made to the distortion compensation coefficient table 15.

Furthermore, in the same way as in the fourth embodiment described in FIG. 9, the operation circuit 30 is provided between the envelope amplitude calculation unit 20 and the set-value comparison/rounding-up unit 21, but what differs from FIG. 9 is that the output of the operation circuit 30 is given to the envelope time-differential calculation unit 25, and the envelope time-differential calculation unit 25 calculates the absolute value of the envelope time differential using the output of the operation circuit 30, and the calculation result is given to the set-value comparison/rounding-down unit 26.

Figure 13:
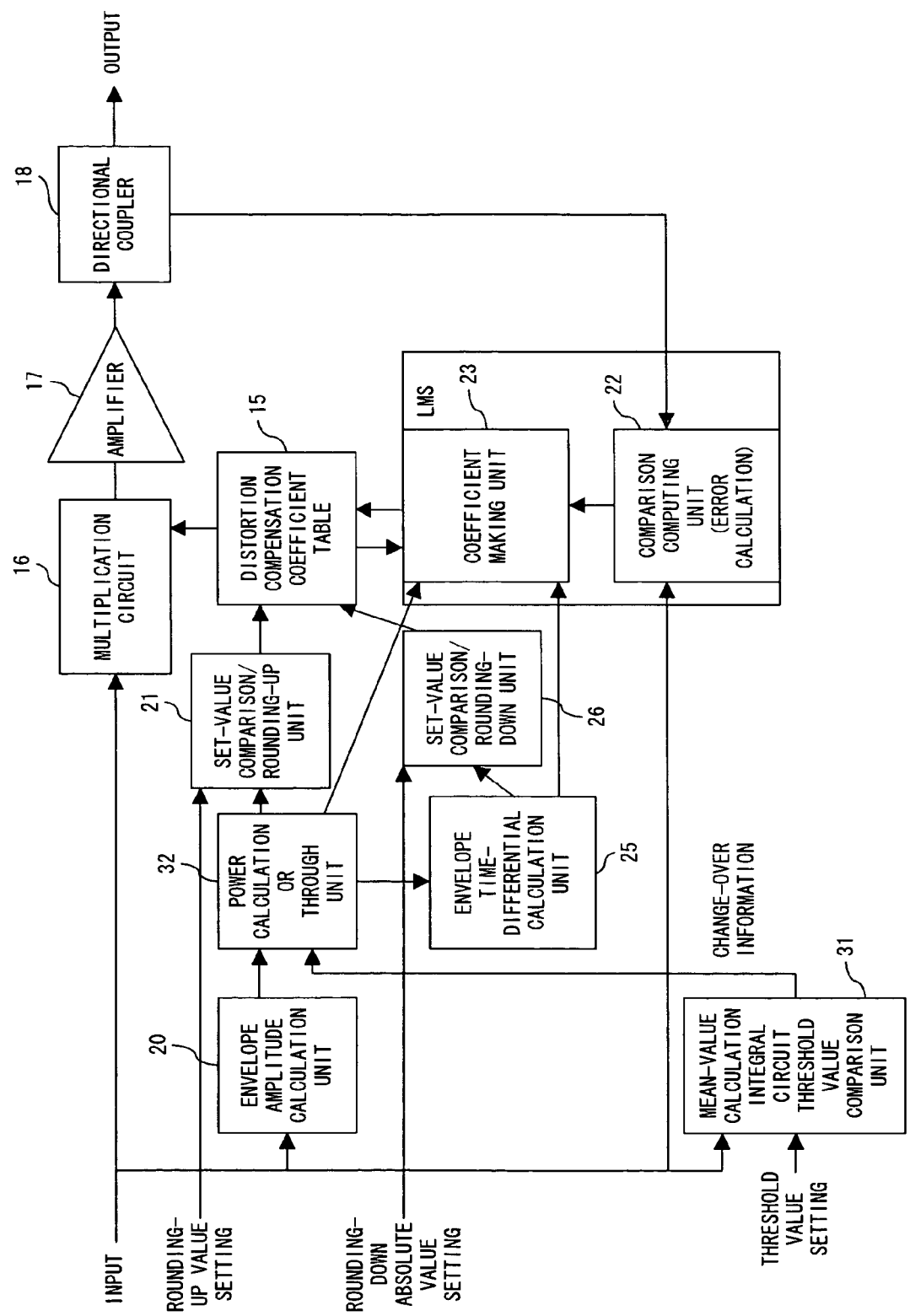
FIG. 13 shows a first example of operation in a fifth embodiment.

FIG. 13 shows a first example of operation in a fifth embodiment. In FIG. 13, in the same way as in FIG. 10, the power calculation or the through unit 32 is used as the operation circuit 30 of FIG. 12, and the envelope time-differential calculation unit 25 calculates the absolute value of the time differential of the envelope using the result obtained by having the value corresponding to the power obtained, for example, by squaring the amplitude value which is calculated by the envelope amplitude calculation unit 20, by the power calculation or the through unit 32. In this case, when the mean power of the signal is large, the mean value calculation integral circuit threshold comparison unit 31 outputs the change-over information which makes power calculation conducted to the power calculation or the through unit 32.

Figure 14:
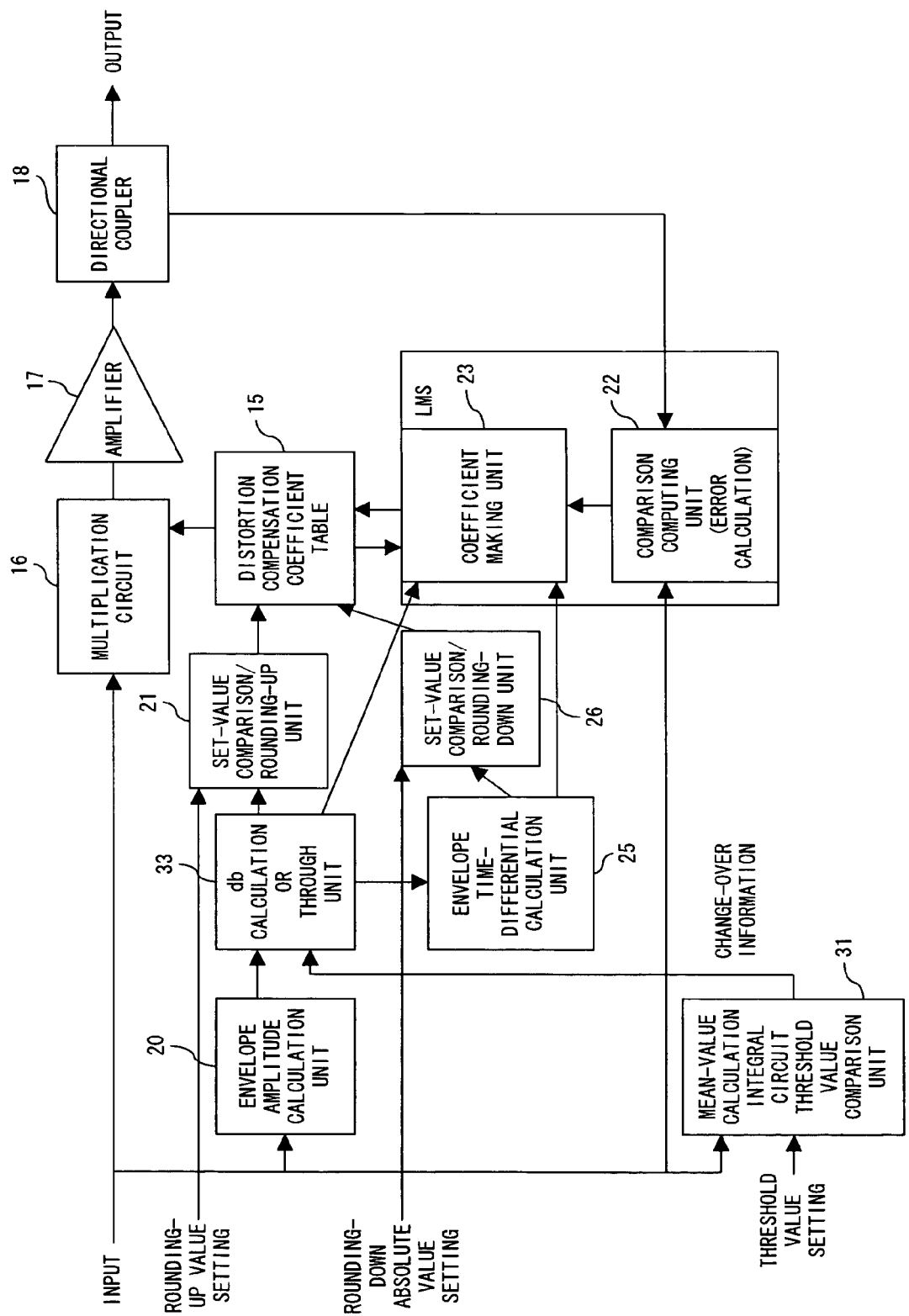
FIG. 14 shows a second example of operation in a fifth embodiment.

FIG. 14 shows a second example of operation in a fifth embodiment. In FIG. 14, in the same way as in FIG. 11, the dB calculation or the through unit 33 is provided in place of the operation circuit 30 shown in FIG. 12. What differs from FIG. 11 is that, for example, when the mean power of the signal is small, the amplitude value calculated by the envelope amplitude calculation unit 20 is converted into a dB value, and the dB value is given to the set-value comparison/rounding-up unit 21, and at the same time, is given to the envelope time-differential calculation unit 25 as well.

Figure 15:
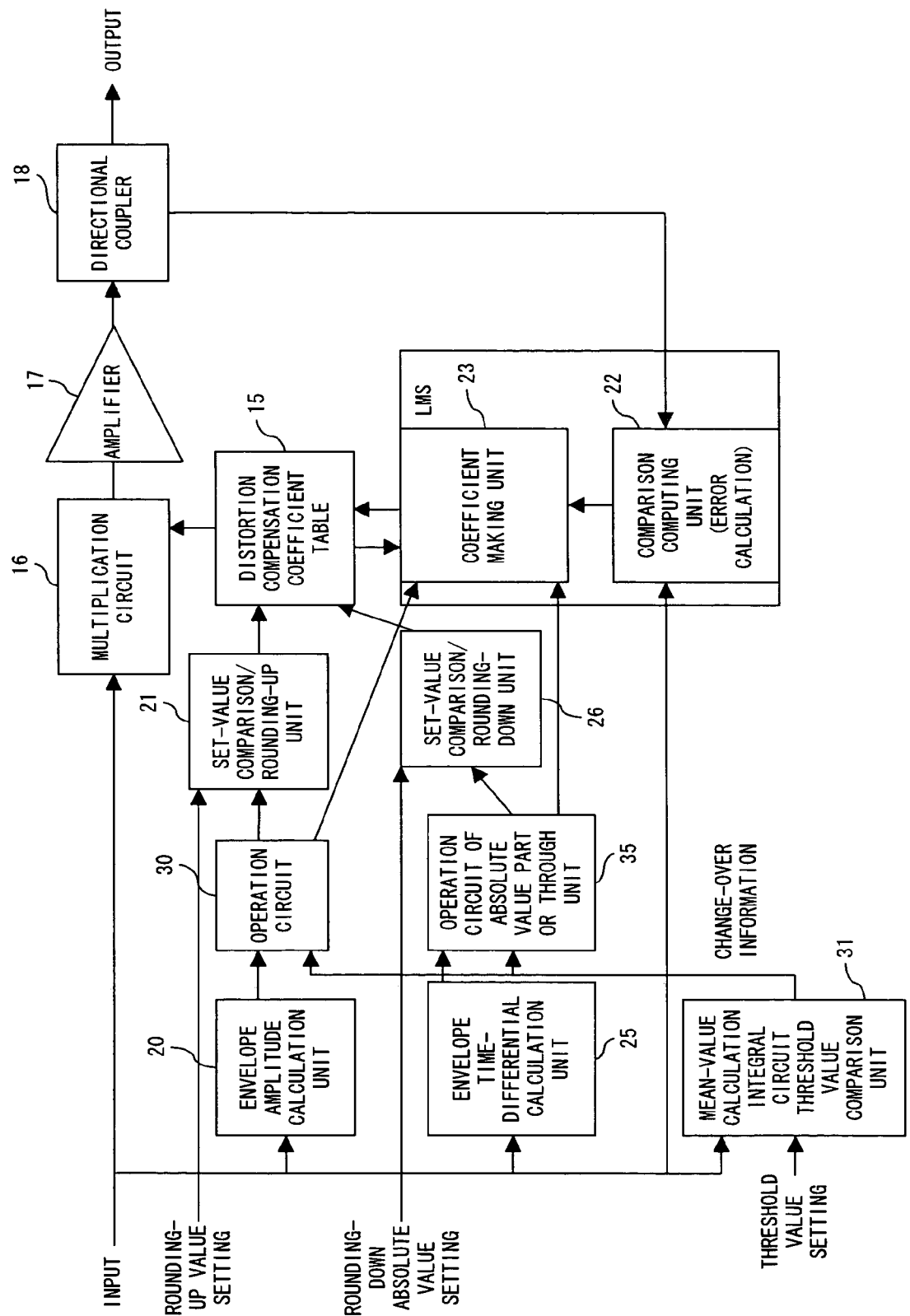
FIG. 15 shows the predistortion method in a sixth embodiment.

FIG. 15 shows the predistortion method in a sixth embodiment. In the sixth embodiment, in the same way as in the third embodiment and the subsequent embodiments, the address for referring to the distortion compensation coefficient table 15 is rounded-up or rounded-down as occasion demands according to the calculation result of the envelope amplitude value and the absolute value of envelope time differential. What differs from the third and subsequent embodiments is that in the fifth embodiment, operation is performed, as occasion demands, for the amplitude value as the calculation result of the envelope amplitude calculation unit 20 by the operation circuit 30, and the calculation result is given to the envelope time-differential calculation unit 25 as well; but in the sixth embodiment, the input signal is given to the envelope time-differential calculation unit 25 in the same way as in the embodiments of up to the fourth embodiment; an operation circuit of an absolute value part or the through unit 35 is provided between the envelope time-differential calculation unit 25 and the set-value comparison/rounding-down unit 26; operation is performed for the absolute value of time differential calculated by the envelope time-differential calculation unit 25, basically, independent of the operation circuit 30; and the calculation result is given to the set-value comparison/rounding-down unit 26.

Change-over information is given to the operation of the absolute value part or the through unit 35 from the mean-value calculation integral circuit threshold comparison unit 31, and whether operation is performed or whether the calculation result of the envelope time-differential calculation unit 25 is given through to the set-value comparison/rounding-down unit 26 is controlled.

Whether the operation circuit 30 performs operation and outputs the calculation result, or whether the calculation result of the envelope amplitude calculation unit 20 as it is is given through to the set-value comparison/rounding-up unit 21 is controlled by the change-over information which is outputted from the mean-value calculation integral circuit threshold comparison unit 31 as described above, but whether or not the operation circuit 30 performs the through operation or whether or not the operation circuit of the absolute value part or the through unit 35 performs the through operation is basically independent.

Figure 16:
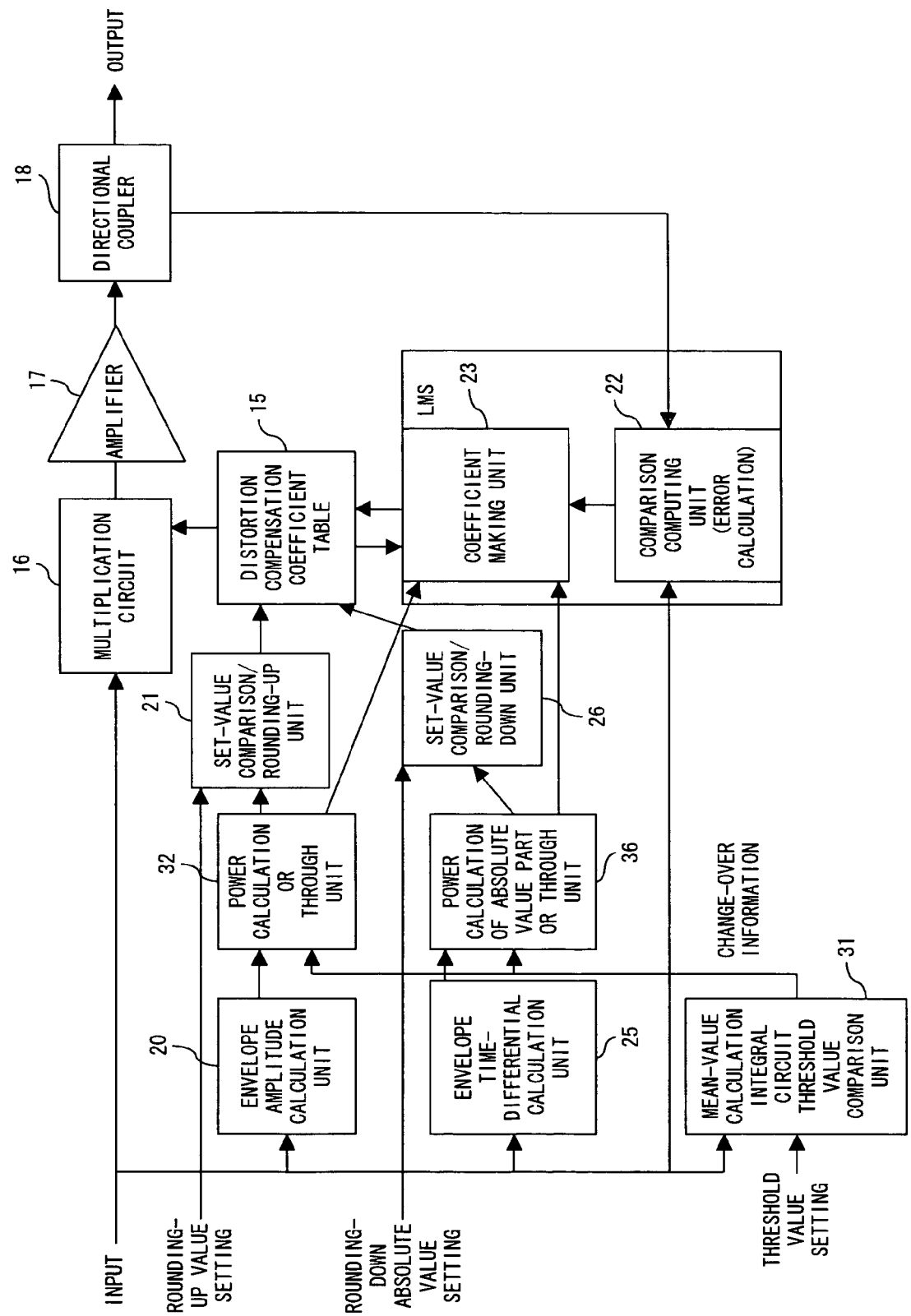
FIG. 16 shows a first example of operation in a sixth embodiment.

FIG. 16 shows a first example of operation in a sixth embodiment. In FIG. 16, the power calculation of the absolute value part or the through unit 36 is provided as the operation circuit of the absolute value part or the through unit 35 shown in FIG. 15, and as the operation circuit 30 the power calculation or the through unit 32 is provided in the same way, for example, as in FIG. 13.

The power calculation or through operation for the calculation result of the envelope amplitude calculation unit 20 and the power calculation or through operation for the absolute value of time differential as the calculation result of the envelope time-differential calculation unit 25 are controlled in accordance with the change-over information from the mean-value calculation integral circuit threshold comparison unit 31.

Figure 17:
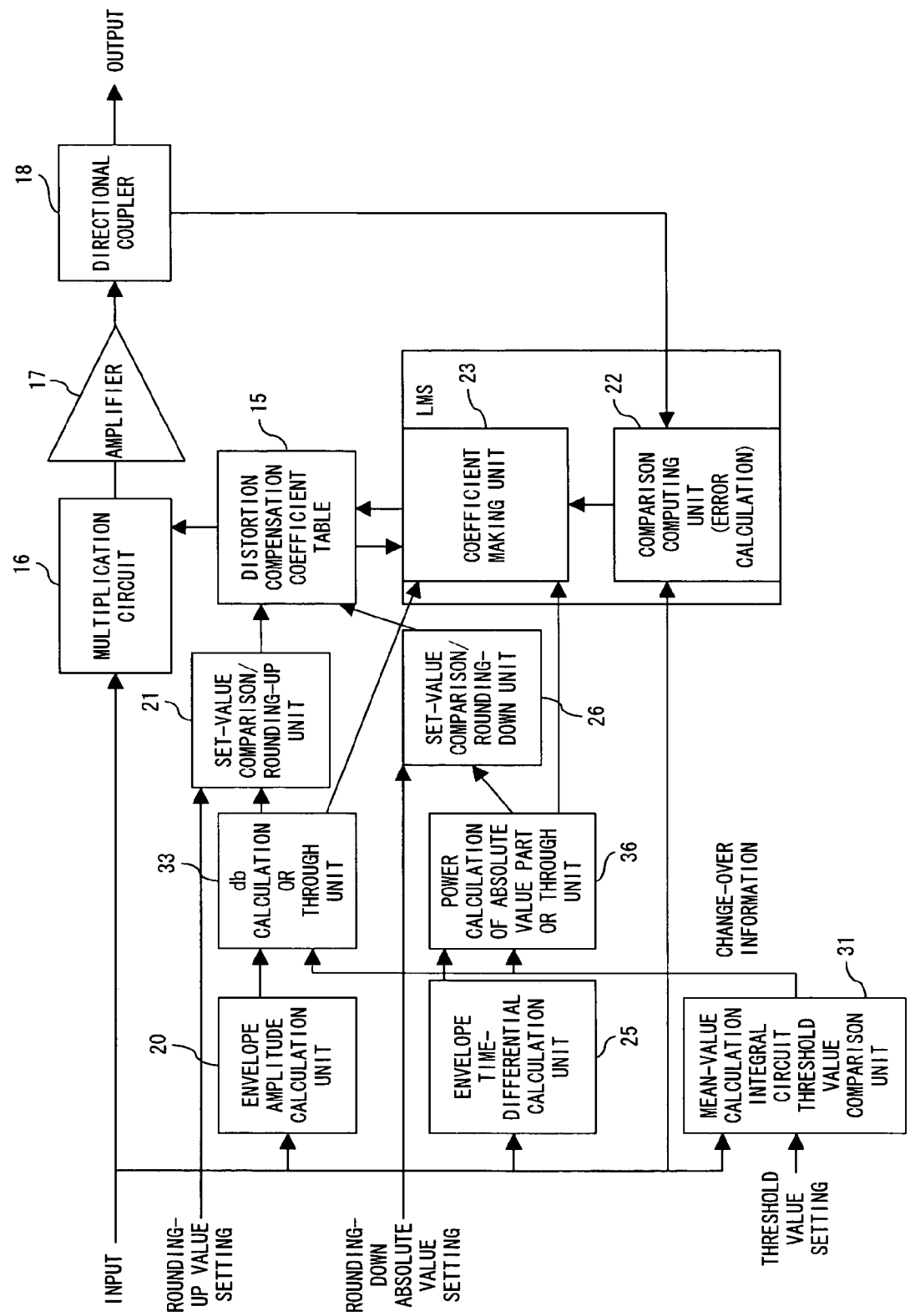
FIG. 17 shows a second example of operation in a sixth embodiment.

FIG. 17 shows a second example of operation in a sixth embodiment. In FIG. 17, the power calculation or through operation by the power calculation of the absolute value part or the through unit 36 is conducted in the same way as in FIG. 16, but what differs from FIG. 16 is that the conversion of the envelope amplitude value into a dB value or through operation is conducted by the dB calculation or the through unit 33 in the operation circuit 30 in the same way, for example, as in FIG. 14.

Described in the above sixth embodiment are an example of using the operation circuit which conducts power calculation for both the operation circuit 30 for the amplitude shown in FIG. 15 and the operation circuit 35 for the absolute value of time differential, and an example of conducting the dB calculation for the amplitude value and the power calculation for the absolute value of time differential. Naturally, it is possible to use the operation circuit which conducts dB calculation for both operation circuits or power calculation for the amplitude value, and dB calculation for the absolute value of time differential as occasion demands.

According to the present invention, it is possible to use a correct distortion compensation coefficient even when there is a frequency amplitude deviation or when there is a delay error between an original signal and an output signal of an amplifier.

In other words, by rounding up the amplitude value, for example, to the upper-limit value within a linear range when the envelope amplitude value is small and referring to the distortion compensation coefficient table, and by rounding down the absolute value of the envelope time differential to a preset absolute value when said value is large and referring to the distortion compensation coefficient table, the accuracy of distortion compensation of an amplifier can be improved, thus contributing very much to the improvement of the performance of an amplifier using a predistorter.

The present invention has been developed to improve the distortion compensation performance of a power amplifier for power transmission and can be used in the radio communications industry such as a cellular phone and in the broadcasting industry such as digital broadcasting.

What is claimed is:

1. A table reference type predistorter which performs operation using a distortion compensation coefficient for an input signal to a power amplifier which outputs a transmission power signal and inputs the signal for which operation has been performed to the power amplifier, comprising:
   a distortion compensation coefficient storage unit for storing a distortion compensation coefficient corresponding to the reference value using the characteristic quantity of the envelope of a transmission signal before being inputted to the power amplifier; and
   a reference value conversion unit for converting the characteristic quantity into a predetermined value according to the size of the characteristic quantity, wherein rounding upwards to a predetermined value and rounding downwards to an absolute value are used.

2. The table reference type predistorter according to claim 1, wherein
   when the characteristic quantity is the amplitude value of the envelope of the transmission signal and the amplitude value is small, the reference value conversion unit rounds up the amplitude value to a predetermined value.

3. The table reference type predistorter according to claim 2, wherein
   when an unmodulated signal is included in the transmission signal, the reference value conversion unit rounds up the amplitude value to a value larger than the predetermined value.

4. The table reference type predistorter according to claim 3, wherein
   when a plurality of unmodulated signals are included in the transmission signal, the reference value conversion unit changes a larger value to round up the reference value according to the number of unmodulated signals.

5. The table reference type predistorter according to claim 1, further comprising an operation unit which gives the result obtained by performing a predetermined operation for a characteristic value of the envelope of the transmission signal according to the mean power of the transmission signal or the result obtained by not performing said predetermined operation according to the mean power of the transmission signal, as the characteristic quantity to the reference value conversion unit.

6. The table reference type predistorter according to claim 5, wherein
   when the characteristic value is the amplitude value of the envelope of the transmission signal, and the mean power of the transmission signal is large, the operation unit converts the amplitude value into power and gives the converted power to the reference value conversion unit, and when the characteristic quantity after the amplitude is converted into power is small, the reference value conversion unit rounds up the characteristic quantity to a predetermined value.

7. The table reference type predistorter according to claim 5, wherein
when the characteristic value is the amplitude value of the envelope of the transmission signal, and the mean power of the transmission signal is small, the operation unit converts the amplitude value into a dB value and gives it to the reference value conversion unit as a characteristic quantity; and
when the characteristic quantity is small, the reference conversion unit rounds up the characteristic quantity to a predetermined value.

8. The table reference type predistorter according to claim 1, wherein
when the characteristic quantity is both the amplitude value of the envelope of the transmission signal and the time differential of the value of the envelope or the value of time derivative, and the amplitude value is small, the reference value conversion unit rounds up that value to a predetermined value.

9. The table reference type predistorter according to claim 1, wherein
when the characteristic quantity is both the amplitude value of the envelope of the transmission signal and the time differential of the value of the envelope or the value of time derivative, and the amplitude value is small, the reference value conversion unit rounds up that value to a predetermined value; and/or
when the time differential or the absolute value of time derivative is large, the reference value conversion unit rounds down that value to a predetermined value and converts that value into the value of the same code as the time differential or time derivative.

10. The table reference type predistorter according to claim 1, further comprising an operation unit which outputs the result obtained by performing a predetermined operation for the amplitude value of the envelope of the transmission signal according to the mean power of the transmission signal or the result obtained by not performing said operation, wherein
the characteristic quantity is both the output of the operation unit and the time differential of the value of the envelope of the transmission signal or the value of time derivative;
when the output of the operation unit is small, the reference value conversion unit rounds up that output value to a predetermined value; and/or
when the time differential or the absolute value of time derivative is large, the reference value conversion unit rounds down that value to a predetermined value and converts that value into a value of the same code as the time differential or time derivative.

11. The table reference type predistorter according to claim 10, wherein
when the mean power of the transmission signal is large, the operation unit performs the operation for converting the amplitude value of the envelope into power.

12. The table reference type predistorter according to claim 10, wherein
when the mean power of the transmission signal is small, the operation unit performs the operation for converting the amplitude value of the envelope to a dB value.

13. The table reference type predistorter according to claim 1, further comprising an operation unit which obtains a first characteristic quantity as the result obtained by performing a predetermined operation for the amplitude value of the envelope according to the mean power of the transmission signal or the result obtained by not performing said operation, and a second characteristic quantity as the time differential of the first characteristic quantity or the value of time derivative, wherein
when the first characteristic quantity is small, the reference value conversion unit rounds up the first characteristic quantity to a predetermined value; and/or when the absolute value of second characteristic quantity is large, the reference value conversion unit rounds down that value to a predetermined value and converts that value into a value of the same code as the second characteristic quantity.

14. The table reference type predistorter according to claim 13, wherein
when the mean power of the transmission signal is large, the reference value conversion unit performs the operation for converting the amplitude value of the envelope into power.

15. The table reference type predistorter according to claim 13, wherein
when the mean power of the transmission signal is small, the reference value conversion unit performs the operation for converting the amplitude value of the envelope into a dB value.

16. The table reference type predistorter according to claim 1, further comprising an operation unit which obtains a first characteristic quantity as the result obtained by performing a first predetermined operation for the amplitude value of the envelope of the transmission signal according to the mean power of the transmission signal or the result obtained by not performing said operation, and a second characteristic quantity as the result obtained by performing the second predetermined operation for the time differential of the envelope value or the absolute value of time derivative, or the result obtained by not performing said operation, wherein
when the first characteristic quantity is small, the reference value conversion unit rounds up the first characteristic quantity to a predetermined value; and/or when the absolute value of second characteristic quantity is large, the reference value conversion unit rounds down the absolute value to a predetermined value and converts that value into a value of the same code as the second characteristic quantity.

17. The table reference type predistorter according to claim 16, wherein
when the mean power of the transmission signal is large, the first operation and/or the second operation is the operation for conversion into power.

18. The table reference type predistorter according to claim 16, wherein
when the mean power of the transmission signal is small, the first operation and/or the second operation is the operation for conversion into a dB value.

* * * * *